United States Patent
Ming et al.

(10) Patent No.: US 11,713,391 B2
(45) Date of Patent: Aug. 1, 2023

(54) RESIN COMPOSITION AND ARTICLE MADE THEREFROM

(71) Applicant: Elite Electronic Material (Zhongshan) Co., Ltd., Zhongshan (CN)

(72) Inventors: Yaoqiang Ming, Zhongshan (CN); Zhilong Hu, Zhongshan (CN)

(73) Assignee: ELITE ELECTRONIC MATERIAL (ZHONGSHAN) CO., LTD., Zhongshan (CN)

(*) Notice: Subject to any disclaimer, the term of this patent is extended or adjusted under 35 U.S.C. 154(b) by 107 days.

(21) Appl. No.: 17/205,653

(22) Filed: Mar. 18, 2021

(65) Prior Publication Data

US 2022/0204746 A1 Jun. 30, 2022

(30) Foreign Application Priority Data

Dec. 28, 2020 (CN) .......................... 202011575771.5
Jan. 21, 2021 (CN) .......................... 202110081577.X

(51) Int. Cl.
*C08L 33/24* (2006.01)
*C08K 3/36* (2006.01)
(Continued)

(52) U.S. Cl.
CPC ............... *C08L 33/24* (2013.01); *C08J 5/244* (2021.05); *C08J 5/246* (2021.05); *C08K 3/36* (2013.01); *C08K 5/3445* (2013.01); *C08K 7/18* (2013.01); *H05K 1/02* (2013.01); *C08K 2201/003* (2013.01); *C08L 63/00* (2013.01); *C08L 79/04* (2013.01); *C08L 2201/08* (2013.01); *C08L 2203/16* (2013.01); *C08L 2203/20* (2013.01); *C08L 2205/03* (2013.01); *H05K 2201/0154* (2013.01)

(58) Field of Classification Search
CPC ....... C08K 3/36; C08K 9/06; C08L 63/00–10; C08L 33/24
See application file for complete search history.

(56) References Cited

U.S. PATENT DOCUMENTS

2013/0260155 A1* 10/2013 Niiyama .............. H05K 1/0353
                                                          428/413
2019/0263087 A1* 8/2019 Kashihara ................ H05K 1/03
2021/0371657 A1* 12/2021 Wang .......................... C08J 5/24

* cited by examiner

*Primary Examiner* — Kregg T Brooks
(74) *Attorney, Agent, or Firm* — Muncy, Geissler, Olds & Lowe, P.C.

(57) ABSTRACT

A resin composition includes 100 parts by weight of a maleimide resin; 20 parts by weight to 60 parts by weight of a benzoxazine resin; 5 parts by weight to 40 parts by weight of an epoxy resin; 120 parts by weight to 240 parts by weight of silica including spherical silica having a sediment volume of less than or equal to 0.4 mL/g and a particle size distribution D50 of less than or equal to 1.0 μm; and 0.5 part by weight to 1.6 parts by weight of an imidazole compound having a long-chain alkyl group, wherein the imidazole compound having a long-chain alkyl group includes octyl-imidazole, undecylimidazole, heptadecylimidazole or a combination thereof. The resin composition may be used to make a prepreg, a resin film, a laminate or a printed circuit board, and at least one of the following improvements can be achieved, including glass transition temperature, ratio of thermal expansion, copper foil peeling strength, thermal resistance after moisture absorption, dissipation factor, amount of resin cluster and appearance of cooper-free circuit board.

11 Claims, 3 Drawing Sheets

(51) Int. Cl.
*C08K 5/3445* (2006.01)
*H05K 1/02* (2006.01)
*C08K 7/18* (2006.01)
*C08J 5/24* (2006.01)
*C08L 79/04* (2006.01)
*C08L 63/00* (2006.01)

RESIN COMPOSITION AND ARTICLE MADE THEREFROM

CROSS-REFERENCE TO RELATED APPLICATIONS

This application claims the priority benefits of China Patent Application No. 202011575771.5, filed on Dec. 28, 2020, and China Patent Application No. 202110081577.X, filed on Jan. 21, 2021. The entirety the above-mentioned patent applications is hereby incorporated by reference herein and made a part of this specification.

BACKGROUND

1. Field of the Disclosure

The present disclosure mainly relates to a resin composition and more particularly to a resin composition comprising a maleimide resin, which is useful for preparing an article such as a prepreg, a resin film, a laminate or a printed circuit board.

2. Description of Related Art

Recently, the electronic technology has been developed towards higher density, lower power consumption and higher performance, thereby presenting more challenges to the high performance electronic materials.

Higher interconnection density per unit area of electronic devices presents more demands on the processability of circuit boards, which not only requires good surface appearance of circuit boards, but also requires higher thermal resistance after moisture absorption of resin materials. Accordingly, in order to enhance the product yield of circuit boards, peel strength of laminates, ratio of thermal expansion and the other properties, inorganic fillers are added to the resin composition. However, conventional resin compositions comprising inorganic fillers are prone to the formation of resin clusters after lamination and resin filling processes of the wiring boards made therefrom, and patterns are usually present on the surface of wiring boards, which results in unstable laminate quality; therefore, it is desirable to solve the problems associated to resin clusters and surface patterns so as to ensure the stability of material quality. Meanwhile, to realize transmission of big data, transmission speed of electronic information needs to be fast, and information transmission needs to be complete without signal loss; therefore, the materials also need to have low dissipation factor to meet the demands of growing amount of electronic information data.

SUMMARY

To overcome the problems of prior arts, particularly one or more above-mentioned technical problems facing conventional materials, it is a primary object of the present disclosure to provide a resin composition and an article made therefrom which may overcome at least one of the above-mentioned technical problems.

Specifically, the resin composition disclosed herein or an article made therefrom achieves improvement in one or more of the following properties: glass transition temperature, ratio of thermal expansion, peel strength (copper foil peeling strength), thermal resistance after moisture absorption, dissipation factor, amount of resin cluster, and surface appearance of copper-free circuit board.

In one aspect, the present disclosure provides a resin composition which comprises 100 parts by weight of a maleimide resin; 20 parts by weight to 60 parts by weight of a benzoxazine resin; 5 parts by weight to 40 parts by weight of an epoxy resin; 120 parts by weight to 240 parts by weight of silica having a sediment volume of less than or equal to 0.4 mL/g and a particle size distribution D50 of less than or equal to 1.0 μm; and 0.5 part by weight to 1.6 parts by weight of an imidazole compound having a long-chain alkyl group, wherein the imidazole compound having a long-chain alkyl group comprises octylimidazole, undecylimidazole, heptadecylimidazole or a combination thereof.

In one embodiment, the maleimide resin comprises 4,4'-diphenylmethane bismaleimide, oligomer of phenylmethane maleimide, m-phenylene maleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl)hexane, N-2,3-xylylmaleimide, N-2,6-xylylmaleimide, N-phenyl maleimide, maleimide resin containing an aliphatic long-chain structure, or a combination thereof.

In one embodiment, the benzoxazine resin comprises oxydianiline benzoxazine resin, alkenyl-containing benzoxazine resin, bisphenol A benzoxazine resin, bisphenol F benzoxazine resin, dicyclopentadiene benzoxazine resin, phenolphthalein benzoxazine resin, phosphorus-containing benzoxazine resin, diamino benzoxazine resin, or a combination thereof.

In one embodiment, the sediment volume is measured by using the following solvent: butanone (a.k.a. methyl ethyl ketone), toluene, dimethyl acetamide, methanol, ethanol, ethylene glycol methyl ether, acetone, methyl isobutyl ketone, cyclohexanone, xylene, methoxyethyl acetate, ethoxyethyl acetate, propoxyethyl acetate, ethyl acetate, dimethylformamide, propylene glycol methyl ether, or a combination thereof.

In one embodiment, in the resin composition, the silica comprises spherical silica having a sediment volume of 0 mL/g and a particle size distribution D50 of less than or equal to 1.0 μm.

In one embodiment, the resin composition comprises 100 parts by weight of a maleimide resin; 30 parts by weight to 60 parts by weight of a benzoxazine resin; 5 parts by weight to 40 parts by weight of an epoxy resin; 120 parts by weight to 240 parts by weight of silica, wherein the silica comprises spherical silica having a sediment volume of 0 mL/g and a particle size distribution D50 of less than or equal to 1.0 μm; and 0.5 part by weight to 1.6 parts by weight of an imidazole compound having a long-chain alkyl group, wherein the imidazole compound having a long-chain alkyl group comprises octylimidazole, undecylimidazole, heptadecylimidazole or a combination thereof.

In one embodiment, a weight ratio of the silica to a total amount of resins is between 0.75:1 and 1.5:1, wherein the total amount of resins comprises all resins in the resin composition except for the silica and the imidazole compound having a long-chain alkyl group. For example, the total amount of resins represents all other components in the resin composition except for inorganic filler (e.g., silica), curing accelerator (e.g., imidazole compound having a long-chain alkyl group), polymerization inhibitor, coloring agent, solvent, toughening agent, and silane coupling agent.

In one embodiment, the resin composition further comprises a cyanate ester resin, a polyolefin resin, a small molecule vinyl compound, an acrylate resin, a phenolic resin, a polyphenylene ether resin, a styrene maleic anhydride resin, a polyester resin, an amine curing agent, a polyamide resin, a polyimide resin, or a combination thereof.

In one embodiment, the resin composition further comprises flame retardant, inorganic filler (such as inorganic filler different from silica), curing accelerator (such as curing accelerator different from the imidazole compound having a long-chain alkyl group), polymerization inhibitor, coloring agent, solvent, toughening agent, silane coupling agent or a combination thereof.

In one embodiment, the spherical silica having a sediment volume of less than or equal to 0.4 mL/g and a particle size distribution D50 of less than or equal to 1.0 μm comprises HM031BNJ silica, HM052BNJ silica, HM052BYJ silica, HM072BNJ silica, HM102BNJ silica or a combination thereof available from JiangSu Finetal Powder Technology Co., Ltd.

In one aspect, the present disclosure provides an article made from the resin composition described above, which comprises a prepreg, a resin film, a laminate or a printed circuit board.

In one embodiment, articles made from the resin composition disclosed herein have one, more or all of the following properties:
- a dissipation factor at 10 GHz as measured by reference to JIS C2565 of less than or equal to 0.0075;
- no delamination after subjecting the article to a thermal resistance test after moisture absorption by reference to IPC-TM-650 2.6.16.1 and IPC-TM-650 2.4.23;
- an amount of resin cluster of less than 20 μm in length contained in a 1 cm rectangular copper-free circuit board sample made from the article, as examined by using a scanning electron microscope, is less than or equal to 8;
- an amount of resin cluster of 20 μm to 75 μm in length contained in a 1 cm rectangular copper-free circuit board sample made from the article, as examined by using a scanning electron microscope, is less than or equal to 1;
- an amount of resin cluster of greater than 75 μm in length contained in a 1 cm rectangular copper-free circuit board sample made from the article, as examined by using a scanning electron microscope, is 0; and
- a copper-free circuit board sample made from the article is absent of patterns on its surface as examined by visual inspection.

DESCRIPTION OF THE EMBODIMENTS

Figure 1:
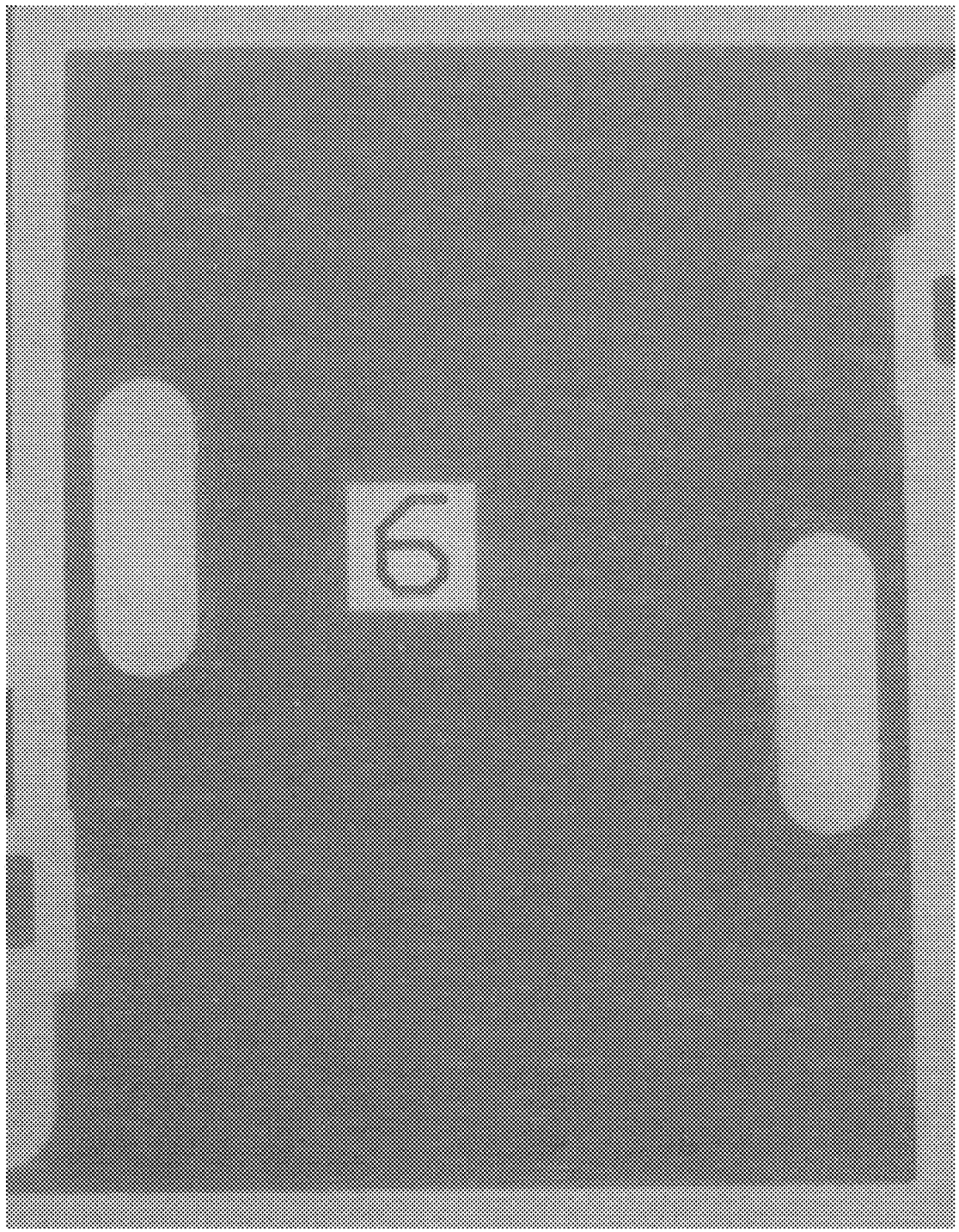
FIG. 1 illustrates a copper-free circuit board having a surface without patterns.

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, the term "comprises," "comprising," "includes," "including," "encompasses," "encompassing," "has," "having" or any other variant thereof is construed as an open-ended transitional phrase intended to cover a non-exclusive inclusion. For example, a composition or manufacture that comprises a list of elements is not necessarily limited to only those elements but may include other elements not expressly listed or inherent to such composition or manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "encompasses," "encompassing," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Similarly, a range of "between 1 and 8" should be understood as explicitly disclosing all ranges such as 1 to 8, 1 to 7, 2 to 8, 2 to 6, 3 to 6, 4 to 8, 3 to 8 and so on and encompassing the end points of the ranges. Unless otherwise defined, the aforesaid interpretation rule should be applied throughout the present disclosure regardless of broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of X1, X2 and X3," it is intended to disclose the situations of X is X1 and X is X1 and/or X2 and/or X3. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being "selected from a group consisting of X1, X2 and X3" and Y is described as being "selected from a group consisting of Y1, Y2 and Y3," the disclosure includes any combination of X is X1 or X2 or X3 and Y is Y1 or Y2 or Y3.

As used herein, part(s) by weight represents weight part(s) in any weight unit, such as but not limited to kilogram, gram, pound and so on. For example, 100 parts by weight of the maleimide resin may represent 100 kilograms of the maleimide resin or 100 pounds of the maleimide resin.

The following embodiments and examples are illustrative in nature and are not intended to limit the present disclosure and its application. In addition, the present disclosure is not bound by any theory described in the background and summary above or the following embodiments or examples.

As used herein, "or a combination thereof" means "or any combination thereof".

Unless otherwise specified, according to the present disclosure, a resin may include a compound and/or a mixture. A compound may include a monomer or a polymer. A mixture may include two or more compounds and may include a copolymer or auxiliaries, but not limited thereto.

For example, a compound refers to a chemical substance formed by two or more elements bonded with chemical bonds and may be present as a monomer, a polymer, etc., but not limited thereto. A monomer refers to a compound which may participate in a polymerization or prepolymerization reaction to produce a high molecular weight compound. A homopolymer refers to a chemical substance formed by a single compound via polymerization, addition polymerization or condensation polymerization, and a copolymer refers to a chemical substance formed by two or more compounds via polymerization, addition polymerization or condensation polymerization, but not limited thereto. In addition, as used herein, the term "polymer" includes but is not limited to an oligomer. An oligomer refers to a polymer with 2 to 20, typically 2 to 5, repeating units.

As described above, it is a main object of the present disclosure to provide a resin composition, which comprises 100 parts by weight of a maleimide resin; 20 parts by weight to 60 parts by weight of a benzoxazine resin; 5 parts by weight to 40 parts by weight of an epoxy resin; 120 parts by weight to 240 parts by weight of silica which comprises spherical silica having a sediment volume of less than or equal to 0.4 mL/g and a particle size distribution D50 of less than or equal to 1.0 μm; and 0.5 part by weight to 1.6 parts by weight of an imidazole compound having a long-chain alkyl group, wherein the imidazole compound having a long-chain alkyl group comprises octylimidazole, undecylimidazole, heptadecylimidazole or a combination thereof.

For example, unless otherwise specified, the long-chain alkyl group of the imidazole compound having a long-chain alkyl group may substitute any hydrogen atom of the imidazole; for example, the octylimidazole may comprise 1-octylimidazole, 2-octylimidazole and so on, but not limited thereto. For example, the undecylimidazole may comprise 1-undecylimidazole, 2-undecylimidazole and so on, but not limited thereto. For example, the heptadecylimidazole may comprise 1-heptadecylimidazole, 2-heptadecylimidazole and so on, but not limited thereto.

For example, the imidazole compound having a long-chain alkyl group may comprise, but not limited to, 2-octylimidazole (C8Z), 2-undecylimidazole (C11Z), or 2-heptadecylimidazole (C17Z) available from Shikoku Chemicals Corp.

In one embodiment, relative to 100 parts by weight of the maleimide resin, the resin composition disclosed herein comprises 120 parts by weight to 240 parts by weight of silica, such as 120 parts by weight, 160 parts by weight or 240 parts by weight of silica.

The silica comprises spherical silica having a sediment volume of less than or equal to 0.4 mL/g and a particle size distribution D50 of less than or equal to 1.0 μm. For example, the sediment volume may be 0 mL/g, 0.1 mL/g, 0.2 mL/g, 0.3 mL/g or 0.4 mL/g, but not limited thereto. In one embodiment, unless otherwise specified, the particle size distribution D50 of the silica has a numerical tolerance error of ±0.2 μm. For example, a particle size distribution D50 of 1.0 μm represents that the particle size distribution D50 may be 1.0±0.2 μm; that is, the particle size distribution D50 may be 0.8 μm, or the particle size distribution D50 may be 1.0 μm, or the particle size distribution D50 may be 1.2 μm.

Unless otherwise specified, the aforesaid sediment volume refers to the volume of filler, such as but not limited to silica, per unit mass settling in the solvent; lower sediment volume indicates less filler per unit mass settling in the solvent and better dispersivity and fluidity of the filler in the solvent. For example, to measure the sediment volume, an electronic balance (precise to 0.01 gram) may be used to weigh 10 gram of filler to be loaded to a 50 mL graduated cylinder with a ground stopper (precise to 1 mL). The inner wall of the graduated cylinder is washed with a solvent to fully rinse the filler followed by adding the solvent to the capacity of the graduated cylinder and sealing with the stopper; the sample is subject to shaking and vibration at 100-110 revolutions/min for 3 minutes and then stood still at room temperature for 3 hours. The volume of the settled filler is recorded. Each filler is tested for three times, and the measurements are collected when the error between the measurements is less than or equal to 0.10 mL/g, so as to calculate the average sediment volume of the filler per gram settling in the solvent.

For example, the sediment volume of the filler per gram settling in the solvent may be calculated according to Formula (I):

$$X = V/m \qquad \text{Formula (I)}$$

wherein X represents the sediment volume of the filler per gram settling in the solvent, in mL/g;
V represents the volume of settled filler, in mL;
m represents the mass of filler, in g.

In one embodiment, for example, the sediment volume is measured by using, but not limited to, the following solvent: butanone (i.e., methyl ethyl ketone), toluene, dimethyl acetamide, methanol, ethanol, ethylene glycol methyl ether, acetone, methyl isobutyl ketone, cyclohexanone, xylene, methoxyethyl acetate, ethoxyethyl acetate, propoxyethyl acetate, ethyl acetate, dimethylformamide, and propylene glycol methyl ether, which may be used alone or in combination.

For example, the sediment volume may be measured by using a solvent mixture comprising butanone and dimethyl acetamide at any ratio. For example, butanone and dimethyl acetamide may be mixed at a ratio of 1:9, 9:1, 1:1, 1:2, 2:1, 3:2, 4:5, 7:6, or 8:9, but not limited thereto.

In one embodiment, for example, unless otherwise specified, the particle size distribution D50 is the value of the particle diameter at 50% in the cumulative distribution of the filler, such as but not limited to spherical silica, as measured by using laser scattering. For example, the spherical silica having a sediment volume of less than or equal to 0.4 mL/g and a particle size distribution D50 of less than or equal to 1.0 μm preferably has a particle size distribution D50 of less than 1.0 μm.

In one embodiment, the spherical silica having a sediment volume of less than or equal to 0.4 mL/g and a particle size distribution D50 of less than or equal to 1.0 μm may be characterized by, but not limited to, having a specific surface area of 4 $m^2/g$ to 20 $m^2/g$, a purity of silica content of greater than or equal to 99.99%, or a sphericity of greater than or equal to 95%.

For example, the spherical silica having a sediment volume of less than or equal to 0.4 mL/g and a particle size distribution D50 of less than or equal to 1.0 μm may be surface-treated with a silane coupling agent. For example, the silane coupling agent may comprise, but not limited to, any one or more of alkyl-containing silane coupling agent, unsaturated double bond-containing silane coupling agent, epoxy-containing silane coupling agent, phenyl-containing silane coupling agent, amino-containing silane coupling agent, and acrylate-containing silane coupling agent.

For example, the spherical silica having a sediment volume of less than or equal to 0.4 mL/g and a particle size distribution D50 of less than or equal to 1.0 μm may be available from JiangSu Finetal Powder Technology Co., Ltd. (http://www.jshuimai.com/index.aspx), such as the silica under the product name HM031BNJ, HM052BNJ, HM052BYJ, HM072BNJ or HM102BNJ.

In one embodiment, the silica may further comprise, in addition to the spherical silica having a sediment volume of less than or equal to 0.4 mL/g and a particle size distribution D50 of less than or equal to 1.0 μm, other silica, such as but not limited to spherical or non-spherical silica having a sediment volume of greater than 0.4 mL/g and/or a particle size distribution D50 of greater than 1.0 μm.

In one embodiment, the resin composition according to the present disclosure comprises, relative to 100 parts by weight of the maleimide resin, 120 parts by weight to 240 parts by weight of silica, wherein the silica preferably comprises spherical silica having a sediment volume of 0 mL/g and a particle size distribution D50 of less than or equal to 1.0 μm.

In one embodiment, for example, the maleimide resin used herein refers to a compound or a mixture containing at least one maleimide group. Unless otherwise specified, the maleimide resin used in the present disclosure is not particularly limited and may include any one or more maleimide resins useful for preparing a prepreg, a resin film, a laminate or a printed circuit board. Examples include but are not limited to 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl)hexane, N-2,3-xylyl maleimide, N-2,6-xylylmaleimide, N-phenylmaleimide, maleimide resin containing aliphatic long-chain structure or a combination thereof. In addition, unless otherwise specified, the aforesaid maleimide resin of the present disclosure may also comprise a prepolymer thereof, such as a prepolymer of diallyl compound and maleimide resin, a prepolymer of diamine and maleimide resin, a prepolymer of multi-functional amine and maleimide resin or a prepolymer of acid phenol compound and maleimide resin, but not limited thereto.

For example, the maleimide resin may include products such as BMI-1000, BMI-1000H, BMI-1100, BMI-1100H, BMI-2000, BMI-2300, BMI-3000, BMI-3000H, BMI-4000H, BMI-5000, BMI-5100, BM-7000 and BMI-7000H available from Daiwakasei Co., Ltd., or products such as BMI-70 and BMI-80 available from K.I Chemical Industry Co., Ltd.

For example, the maleimide resin containing aliphatic long-chain structure may include products such as BMI-689, BMI-1400, BMI-1500, BMI-1700, BMI-2500, BMI-3000, BMI-5000 and BMI-6000 available from Designer Molecules Inc.

For example, unless otherwise specified, the benzoxazine resin used in the present disclosure is not particularly limited and may include any one or more benzoxazine resins useful for making a prepreg, a resin film, a laminate or a printed circuit board. Examples include but are not limited to oxydianiline benzoxazine resin, alkenyl-containing benzoxazine resin, bisphenol A benzoxazine resin, bisphenol F benzoxazine resin, dicyclopentadiene benzoxazine resin, phenolphthalein benzoxazine resin, phosphorus-containing benzoxazine resin, and diamino benzoxazine resin. The alkenyl-containing benzoxazine resin refers to a benzoxazine resin having a carbon-carbon double bond (C=C) or a functional group derived therefrom, examples thereof including but not limited to the presence of a carbon-carbon double bond such as a vinyl group, an allyl group, a vinylbenzyl group or the like in its structure. For example, the alkenyl-containing benzoxazine resin may be allyl-modified benzoxazine resin, which may be any one or a mixture of allyl-modified bisphenol A benzoxazine resin, allyl-modified bisphenol F benzoxazine resin, allyl-modified dicyclopentadiene phenol benzoxazine resin, allyl-modified bisphenol S benzoxazine resin and diamino benzoxazine resin. The mixture may be for example a mixture of allyl-modified bisphenol A benzoxazine resin and allyl-modified bisphenol F benzoxazine resin; a mixture of allyl-modified dicyclopentadiene phenol benzoxazine resin and allyl-modified bisphenol S benzoxazine resin; a mixture of allyl-modified dicyclopentadiene phenol benzoxazine resin and allyl-modified bisphenol F benzoxazine resin; or a mixture of allyl-modified dicyclopentadiene phenol benzoxazine resin and allyl-modified bisphenol A benzoxazine resin. The diamino benzoxazine resin may be diaminodiphenylmethane benzoxazine resin, diaminodiphenyl sulfone benzoxazine resin, diaminodiphenyl sulfide benzoxazine resin or a combination thereof.

For example, the benzoxazine resin may include LZ-8270 (phenolphthalein benzoxazine resin), LZ-8280 (bisphenol F benzoxazine resin) or LZ-8290 (bisphenol A benzoxazine resin) available from Huntsman, PF-3500 (oxydianiline benzoxazine resin) available from Chang Chun Plastics, or HFB-2006M (phosphorus-containing benzoxazine resin) available from Showa High Polymer.

In one embodiment, relative to 100 parts by weight of the maleimide resin, the resin composition disclosed herein comprises 20 parts by weight to 60 parts by weight of the benzoxazine resin, such as 30 parts by weight, 40 parts by weight or 50 parts by weight of the benzoxazine resin. In one embodiment, the resin composition disclosed herein comprises 30 parts by weight to 60 parts by weight of the benzoxazine resin relative to 100 parts by weight of the maleimide resin.

For example, the epoxy resin described herein may be any one or more epoxy resins known in the field to which this disclosure pertains, including but not limited to bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional novolac epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin, or a combination thereof. The novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin. The phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin; the DOPO-HQ epoxy resin may be any one or more selected from DOPO-HQ-containing phenolic novolac epoxy resin, DOPO-HQ-containing cresol novolac epoxy resin and DOPO-HQ-containing bisphenol-A novolac epoxy resin.

For example, the epoxy resin may include, but not limited to, NC-3000H (biphenyl epoxy resin) available from Nippon Kayaku, HP-7200HH (dicyclopentadiene epoxy resin) available from D.I.C. Corporation, or NPPN260 (2,6-dimethyl phenol novolac epoxy resin) available from Nan Ya Plastics Corporation.

In one embodiment, relative to 100 parts by weight of the maleimide resin, the resin composition disclosed herein comprises 5 parts by weight to 40 parts by weight of the epoxy resin, such as 10 parts by weight, 20 parts by weight or 30 parts by weight of the epoxy resin.

In one embodiment, the resin composition according to the present disclosure comprises, relative to 100 parts by weight of the maleimide resin, 120 parts by weight to 240 parts by weight of silica, wherein the silica preferably comprises spherical silica having a sediment volume of 0 mL/g and a particle size distribution D50 of less than or equal to 1.0 μm.

In one embodiment, a weight ratio of the silica to a total amount of resins is between 0.75:1 and 1.5:1. For example, the weight ratio of the silica to the total amount of resins may be 0.75:1, 0.8:1, 0.9:1, 1:1, 1.2:1 or 1.5:1, but not limited thereto.

In one embodiment, the total amount of resins includes all resins in the resin composition. For example, the total amount of resins comprises all resins in the resin composition except for the silica and the imidazole compound having a long-chain alkyl group. For example, the total amount of resins represents all other components in the resin composition except for inorganic filler (e.g., silica), curing accelerator (e.g., imidazole compound having a long-chain alkyl group), polymerization inhibitor, coloring agent, solvent, toughening agent, and silane coupling agent.

For example, the total amount of resins comprises, in part by weight, the maleimide resin, the epoxy resin and the benzoxazine resin, but not limited thereto. For example, the total amount of resins may further comprise the amount of cyanate ester, polyolefin resin, flame retardant or a combination thereof, in part by weight. For example, in one embodiment, the total amount of resins is exclusive of the silica and the imidazole compound having a long-chain alkyl group and is inclusive of the maleimide resin, the epoxy resin and the benzoxazine resin in part by weight; for example, in one embodiment, the total amount of resins, in part by weight, is exclusive of inorganic filler (e.g., silica), curing accelerator (e.g., imidazole compound having a long-chain alkyl group), polymerization inhibitor, toughening agent, coloring agent, silane coupling agent and solvent, and is inclusive of the maleimide resin, the epoxy resin, the benzoxazine resin and the cyanate ester, in part by weight.

In one embodiment, for example, the resin composition disclosed herein may further optionally comprise a cyanate ester, a polyolefin resin, a small molecule vinyl compound, an acrylate resin, a phenolic resin, a polyphenylene ether resin, a styrene maleic anhydride resin, a polyester resin, an amine curing agent, a polyamide resin, a polyimide resin or a combination thereof.

The cyanate ester resin used herein may include any known cyanate ester resins used in the art, including but not limited to a cyanate ester resin with an Ar—O—C≡N structure (wherein Ar represents an aromatic group, such as benzene, naphthalene or anthracene), a phenol novolac cyanate ester resin, a bisphenol A cyanate ester resin, a bisphenol A novolac cyanate ester resin, a bisphenol F cyanate ester resin, a bisphenol F novolac cyanate ester resin, a dicyclopentadiene-containing cyanate ester resin, a naphthalene-containing cyanate ester resin, a phenolphthalein cyanate ester resin, or a combination thereof. Examples of the cyanate ester resin include but are not limited to Primaset PT-15, PT-30S, PT-60S, BA-200, BA-230S, BA-3000S, BTP-2500, BTP-6020S, DT-4000, DT-7000, ULL950S, HTL-300, CE-320, LUT-50, or LeCy available from Lonza.

For example, the polyolefin resin used herein may include any one or more polyolefin resins useful for preparing a prepreg, a resin film, a laminate or a printed circuit board. Examples include but are not limited to styrene-butadiene-divinylbenzene terpolymer, styrene-butadiene-maleic anhydride terpolymer, vinyl-polybutadiene-urethane oligomer, styrene butadiene copolymer, hydrogenated styrene butadiene copolymer, styrene isoprene copolymer, hydrogenated styrene isoprene copolymer, methylstyrene homopolymer, petroleum resin, cycloolefin copolymer and a combination thereof.

For example, the small molecule vinyl compound as used herein refers to a vinyl-containing compound with a molecular weight of less than or equal to 1000, preferably between 100 and 900 and more preferably between 100 and 800. In one embodiment, the small molecule vinyl compound may include, but not limited to, divinylbenzene (DVB), bis(vinylbenzyl) ether (BVBE), bis(vinylphenyl)ethane (BVPE), triallyl isocyanurate (TAIC), triallyl cyanurate (TAC), 1,2,4-trivinyl cyclohexane (TVCH) or a combination thereof.

For example, the acrylate resin as used herein may include, but not limited to, tricyclodecane di(meth)acrylate, tri(meth)acrylate, 1,1'-[(octahydro-4,7-methano-1H-indene-5,6-diyl)bis(methylene)]ester (e.g., SR833S, available from Sartomer) or a combination thereof.

For example, the phenolic resin used herein may be a mono-functional, bifunctional or multi-functional phenolic resin. The type of the phenolic resin is not particularly limited and may include those currently used in the field to which this disclosure pertains. Preferably, the phenolic resin is selected from a phenoxy resin, a novolac resin and a combination thereof.

For example, the polyphenylene ether resin used in this invention is not particularly limited and may be any one or more commercial products or a combination thereof; examples include but are not limited to dihydroxyl polyphenylene ether resin (e.g., SA90 available from SABIC), bis(vinylbenzyl) polyphenylene ether resin with a number average molecular weight of about 1200 (such as OPE-2st 1200, available from Mitsubishi Gas Chemical Co., Inc.), bis(vinylbenzyl) polyphenylene ether resin with a number average molecular weight of about 2200 (such as OPE-2st 2200, available from Mitsubishi Gas Chemical Co., Inc.), vinyl-benzylated modified bisphenol A polyphenylene ether, methacrylic polyphenylene ether resin (e.g., SA9000 available from SABIC), amino-terminated polyphenylene ether resin, maleimide or maleic anhydride-modified polyphenylene ether resin, vinyl-containing chain-extended polyphenylene ether resin with a number average molecular weight of about 2200 to 3000, or a combination thereof. The vinyl-containing chain-extended polyphenylene ether resin may include various polyphenylene ether resins disclosed in the US Patent Application Publication No. 2016/0185904 A1, all of which are incorporated herein by reference in their entirety.

For example, the styrene maleic anhydride resin used herein may have a ratio of styrene (S) to maleic anhydride (MA) of 1:1, 2:1, 3:1, 4:1, 6:1, or 8:1, examples including but not limited to styrene maleic anhydride copolymers such as SMA-1000, SMA-2000, SMA-3000, EF-30, EF-40, EF-60 and EF-80 available from Cray Valley, or styrene maleic anhydride copolymers such as C400, C500, C700 and C900 available from Polyscope. In addition, the styrene maleic anhydride resin may also be an esterified styrene maleic anhydride copolymer, such as esterified styrene maleic anhydride copolymers SMA1440, SMA17352, SMA2625, SMA3840 and SMA31890 available from Cray Valley. Unless otherwise specified, the styrene maleic anhydride resin can be added individually or as a combination to the resin composition of this disclosure.

For example, the polyester resin used herein may be obtained by esterification of an aromatic compound with two carboxylic groups and an aromatic compound with two hydroxyl groups, such as but not limited to HPC-8000, HPC-8150 or HPC-8200 available from DIC Corporation.

For example, the amine curing agent used herein may be dicyandiamide, diamino diphenyl sulfone, diamino diphenyl methane, diamino diphenyl ether, diamino diphenyl sulfide or a combination thereof, but not limited thereto.

For example, the polyamide resin used herein may be any polyamide resin known in the field to which this disclosure pertains, including but not limited to various commercially available polyamide resin products.

For example, the polyimide resin used herein may be any polyimide resin known in the field to which this disclosure pertains, including but not limited to various commercially available polyimide resin products.

In one embodiment, for example, the resin composition disclosed herein may further optionally comprise flame retardant, inorganic filler, curing accelerator, polymerization inhibitor, coloring agent, solvent, toughening agent, silane coupling agent or a combination thereof.

For example, in one embodiment, the flame retardant used herein may be any one or more flame retardants useful for preparing a prepreg, a resin film, a laminate or a printed circuit board; examples of the flame retardant include but are not limited to a phosphorus-containing flame retardant, such as any one, two or more selected from the following group: ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, diphenylphosphine oxide (DPPO) and its derivatives or resins, melamine cyanurate, tri-hydroxy ethyl isocyanurate, aluminium phosphinate (e.g., commercially available OP-930 and OP-935), or a combination thereof.

For example, the flame retardant used herein may be a DPPO (diphenyl phosphine oxide) compound (e.g., di-DPPO compound), a DOPO (9,10-dihydro-9-oxa-10-phosphaphenanthrene-10-oxide) compound (e.g., di-DOPO compound), a DOPO resin (e.g., DOPO-HQ, DOPO-NQ, DOPO-PN, and DOPO-BPN), and a DOPO-containing epoxy resin, etc., wherein DOPO-PN is a DOPO-containing phenol novolac compound, and DOPO-BPN may be a DOPO-containing bisphenol novolac compound, such as DOPO-BPAN (DOPO-bisphenol A novolac), DOPO-BPFN (DOPO-bisphenol F novolac) or DOPO-BPSN (DOPO-bisphenol S novolac), etc.

For example, in one embodiment, the inorganic filler used herein different from the spherical silica having a sediment volume of less than or equal to 0.4 mL/g and a particle size distribution D50 of less than or equal to 1.0 μm may be any one or more inorganic fillers used for preparing a resin film, a prepreg, a laminate or a printed circuit board; examples include but are not limited to silica (fused, non-fused, porous or hollow type, having a sediment volume of greater than 0.4 mL/g and a particle size distribution D50 of greater than to 1.0 μm), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (A100H), calcined talc, talc, silicon nitride, and calcined kaolin. Moreover, the inorganic filler can be spherical, fibrous, plate-like, particulate, sheet-like or whisker-like and can be optionally pretreated by a silane coupling agent.

In one embodiment, for example, the curing accelerator (including curing initiator) suitable for the present disclosure different from the imidazole compound having a long-chain alkyl group may comprise a catalyst, such as a Lewis base or a Lewis acid. The Lewis base may comprise any one or more of imidazole (which is different from the imidazole compound having a long-chain alkyl group), boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di (tert-butylperoxy)-3-hexyne (25B), bis(tert-butylperoxyisopropyl)benzene or a combination thereof.

In one embodiment, for example, the polymerization inhibitor used herein is not particularly limited and may be any polymerization inhibitor known in the field to which this disclosure pertains, including but not limited to various commercially available polymerization inhibitor products. For example, the polymerization inhibitor may comprise, but not limited to, 1,1-diphenyl-2-picrylhydrazyl radical, methyl acrylonitrile, dithioester, nitroxide-mediated radical, triphenylmethyl radical, metal ion radical, sulfur radical, hydroquinone, 4-methoxyphenol, p-benzoquinone, phenothiazine, β-phenylnaphthylamine, 4-t-butylcatechol, methylene blue, 4,4'-butylidenebis(6-t-butyl-3-methylphenol), 2,2'-methylenebis(4-ethyl-6-t-butyl phenol) or a combination thereof.

For example, the nitroxide-mediated radical may comprise, but not limited to, nitroxide radicals derived from cyclic hydroxylamines, such as 2,2,6,6-substituted piperidine 1-oxyl free radical, 2,2,5,5-substituted pyrrolidine 1-oxyl free radical or the like. Preferred substitutes include alkyl groups with 4 or fewer carbon atoms, such as methyl group or ethyl group. Examples of the compound containing a nitroxide radical include such as 2,2,6,6-tetramethylpiperidine 1-oxyl free radical, 2,2,6,6-tetraethylpiperidine 1-oxyl free radical, 2,2,6,6-tetramethyl-4-oxo-piperidine 1-oxyl free radical, 2,2,5,5-tetramethylpyrrolidine 1-oxyl free radical, 1,1,3,3-tetramethyl-2-isoindoline oxygen radical, N,N-di-tert-butylamine oxygen free radical and so on. Nitroxide radicals may also be replaced by using stable radicals such as galvinoxyl radicals.

The polymerization inhibitor suitable for the resin composition of the present disclosure may include products derived from the polymerization inhibitor with its hydrogen atom or group substituted by other atom or group. Examples include products derived from a polymerization inhibitor with its hydrogen atom substituted by an amino group, a hydroxyl group, a carbonyl group or the like.

In one embodiment, for example, the coloring agent suitable for the present disclosure may comprise, but not limited to, dye or pigment.

In one embodiment, for example, the purpose of adding solvent is to change the solid content of the resin composition and to adjust the viscosity of the resin composition. For example, the solvent may comprise, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

In one embodiment, for example, the purpose of adding toughening agent is to improve the toughness of the resin composition. The toughening agent may comprise, but not limited to, carboxyl-terminated butadiene acrylonitrile rubber (CTBN rubber), core-shell rubber, or a combination thereof.

In one embodiment, for example, the silane coupling agent used herein may comprise silane (such as but not limited to siloxane) and may be further categorized according to the functional groups into amino silane compound, epoxide silane compound, vinylsilane compound, acrylate silane compound, methacrylate silane compound, hydroxylsilane compound, isocyanate silane compound, methacryloxy silane compound and acryloxy silane compound.

The resin composition of various embodiments may be processed to make different articles, such as those suitable for use as components in electronic products, including but not limited to a prepreg, a resin film, a laminate or a printed circuit board.

For example, the resin composition from each embodiment of this disclosure can be used to make a prepreg, which comprises a reinforcement material and a layered structure disposed thereon. The layered structure is formed by heating the resin composition at a high temperature to the semi-cured state (B-stage). Suitable baking temperature for making the prepreg is 165° C. to 200° C. The reinforcement material may be any one of a fiber material, woven fabric, and non-woven fabric, and the woven fabric preferably comprises fiberglass fabrics. Types of fiberglass fabrics are not particularly limited and may be any commercial fiberglass fabric used for various printed circuit boards, such as E-glass fabric, D-glass fabric, S-glass fabric, T-glass fabric, L-glass fabric or Q-glass fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pretreated by a silane coupling agent. The prepreg may be further heated and cured to the C-stage to form an insulation layer.

For example, the resin composition from each embodiment of this disclosure can be used to make a resin film, which is prepared by heating and baking to semi-cure the resin composition. The resin composition may be selectively coated on a polyethylene terephthalate film (PET film), a polyimide film (PI film), a copper foil or a resin-coated copper, followed by heating and baking to semi-cure the resin composition to form the resin film.

For example, the resin composition from each embodiment of this disclosure can be used to make a laminate, which comprises two metal foils and an insulation layer disposed between the metal foils, wherein the insulation layer is made by curing the resin composition at high temperature and high pressure to the C-stage, a suitable curing temperature being for example between 180° C. and 220° C. and preferably between 200° C. and 210° C. and a suitable curing time being 60 to 180 minutes and preferably 80 to 100 minutes. The insulation layer may be formed by curing the aforesaid prepreg or resin film to the C-stage. The metal foil may comprise copper, aluminum, nickel, platinum, silver, gold or alloy thereof, such as a copper foil.

Preferably, the laminate is a copper-clad laminate (CCL).

In addition, the laminate may be further processed by trace formation processes to make a circuit board, such as a printed circuit board.

For example, the resin composition disclosed herein or an article made therefrom achieves improvement in one or more of the following properties: glass transition temperature, Z-axis ratio of thermal expansion, copper foil peeling strength, thermal resistance after moisture absorption, dissipation factor, amount of resin cluster, and surface appearance of copper-free circuit board.

For example, the resin composition according to the present disclosure or the article made therefrom may achieve one, more or all of the following properties:
- a higher glass transition temperature as measured by reference to IPC-TM-650 2.4.24.4, such as a glass transition temperature Tg of greater than or equal to 301° C., such as between 301° C. and 333° C.;
- a Z-axis ratio of thermal expansion as measured by reference to IPC-TM-650 2.4.24.5 of less than or equal to 1.33%, such as between 1.08% and 1.33%;
- a higher copper foil peeling strength as measured by reference to IPC-TM-650 2.4.8; for example, the copper foil peeling strength of a Hoz reverse treatment copper foil is greater than or equal to 4.7 lb/in, such as between 4.7 lb/in and 5.3 lb/in or between 4.8 lb/in and 5.3 lb/in; for example, the copper foil peeling strength of an ultra-thin copper foil of less than or equal to 2 μm in thickness is greater than or equal to 4.3 lb/in, such as between 4.3 lb/in and 4.9 lb/in or between 4.4 lb/in and 4.9 lb/in;

no delamination after subjecting the article to a thermal resistance test after moisture absorption by reference to IPC-TM-650 2.6.16.1 and IPC-TM-650 2.4.23;

a dissipation factor at 10 GHz as measured by reference to JIS C2565 of less than or equal to 0.0075, such as between 0.0068 and 0.0075;

fewer resin cluster in a 1cm rectangular copper-free circuit board sample made from the article as examined by using a scanning electron microscope; for example, the amount of resin cluster of less than 20 µm in length in the sample as examined by using a scanning electron microscope is less than or equal to 8, such as between 0 and 8 or between 0 and 6; for example, the amount of resin cluster of 20 µm to 75 µm in length in the sample as examined by using a scanning electron microscope is less than or equal to 1, such as 0; and for example, the amount of resin cluster of greater than 75 µm in length in the sample as examined by using a scanning electron microscope is 0; and a copper-free circuit board sample made from the article is absent of patterns on its surface as examined by visual inspection.

Raw materials below are used to prepare the resin compositions of various Examples and Comparative Examples of the present disclosure according to the amount listed in Table 7 to Table 12 and further fabricated to prepare test samples or articles. Test results of Examples and Comparative Examples are listed in Table 13 to Table 18 below.

BMI-2300: phenylmethane maleimide oligomer, available from Daiwa Fine Chemicals Co., Ltd.

BMI-70: aromatic bismaleimide resin, available from K.I Chemical Industry Co., Ltd.

BMI-3000: maleimide resin containing aliphatic long-chain structure, available from Designer Molecules Inc.

BMI-80: aromatic bismaleimide resin, available from K.I Chemical Industry Co., Ltd.

PF-3500: oxydianiline benzoxazine resin, available from Chang Chun Plastics.

LZ8290: bisphenol A benzoxazine resin, available from Huntsman.

LZ8280: bisphenol F benzoxazine resin, available from Huntsman.

KZH-5031: allyl-modified dicyclopentadiene phenol benzoxazine resin, prepared by the Applicant or purchased from Kolon.

NC-3000H: biphenyl epoxy resin, available from Nippon Kayaku.

NPPN260: 2,6-dimethyl phenol novolac epoxy resin, available from Nan Ya Plastics Corporation.

HP-7200HH: dicyclopentadiene epoxy resin, available from D.I.C. Corporation.

HM031BNJ: spherical silica treated by amino-containing silane coupling agent, having a sediment volume of 0 mL/g and a particle size distribution D50 of 0.3 µm, available from JiangSu Finetal Powder Technology Co., Ltd.

HM052BNJ: spherical silica treated by amino-containing silane coupling agent, having a sediment volume of 0 mL/g and a particle size distribution D50 of 0.5 µm, available from JiangSu Finetal Powder Technology Co., Ltd.

HM052BYJ: spherical silica treated by acrylate-containing silane coupling agent, having a sediment volume of 0 mL/g and a particle size distribution D50 of 0.5 µm, available from JiangSu Finetal Powder Technology Co., Ltd.

HM072BNJ: spherical silica treated by amino-containing silane coupling agent, having a sediment volume of 0 mL/g and a particle size distribution D50 of 0.7 µm, available from JiangSu Finetal Powder Technology Co., Ltd.

HM102BNJ: spherical silica treated by amino-containing silane coupling agent, having a sediment volume of 0.39 mL/g and a particle size distribution D50 of 1.0 µm, available from JiangSu Finetal Powder Technology Co., Ltd.

Spherical silica A: spherical silica treated by amino-containing silane coupling agent, having a sediment volume of 0.60 mL/g and a particle size distribution D50 of 0.5 µm, available from Jinyi Silicon Materials Development Co., Ltd.

Spherical silica B: spherical silica treated by acrylate-containing silane coupling agent, having a sediment volume of 1.09 mL/g and a particle size distribution D50 of 0.5 µm, available from Jinyi Silicon Materials Development Co., Ltd.

SC2050-KNK: spherical silica treated by amino-containing silane coupling agent, having a sediment volume of 0.89 mL/g and a particle size distribution D50 of 0.5 µm, available from Admatechs.

Spherical silica C: spherical silica having a particle size distribution D50 of 2 µm, available from Jinyi Silicon Materials Development Co., Ltd.

DL0110: non-spherical fused silica having a particle size distribution D50 of 2 µm, available from Jinyi Silicon Materials Development Co., Ltd.

D70: non-spherical fused silica having a particle size distribution D50 of 7 µm, available from Jinyi Silicon Materials Development Co., Ltd.

KB-01D: boehmite (A100H), available from Union Chemical Ind. Co., Ltd.

C8Z: 2-octylimidazole, available from Shikoku Chemicals Corp.

C11Z: 2-undecylimidazole, available from Shikoku Chemicals Corp.

C17Z: 2-heptadecylimidazole, available from Shikoku Chemicals Corp.

2MZ: 2-methylimidazole, available from Shikoku Chemicals Corp.

2E4MZ: 2-ethyl-4-methylimidazole, available from Shikoku Chemicals Corp.

2PZ: 2-phenylimidazole, available from Shikoku Chemicals Corp.

25B: peroxide, solid content of 100%, available from NOF Corporation.

MEK: methyl ethyl ketone, source not limited.

DMAC: dimethyl acetamide, available from Sinopec Group.

Toluene: available from Chambeco Group.

Measurement and Calculation of Sediment Volume of Silica

Measurement of Sediment Volume

An electronic balance (precise to 0.01 gram) was used to weigh 10 gram of filler to be loaded to a 50 mL graduated cylinder with a ground stopper (precise to 1 mL). The inner wall of the graduated cylinder was washed with a solvent to fully rinse the filler followed by adding the solvent to the capacity of the graduated cylinder and sealing with the stopper; the sample was subject to shaking and vibration at 100-110 revolutions/min for 3 minutes and then stood still at room temperature for 3 hours. The volume of the settled filler was recorded. Each filler was tested for three times, and the measurements were collected when the error between the measurements was less than or equal to 0.10 mL/g, so as to calculate the average sediment volume of the filler per gram settling in the solvent.

Calculation of Sediment Volume

The sediment volume of the filler per gram settling in the solvent was calculated according to Formula (I):

$$X = V/m \qquad \text{Formula (I)}$$

wherein X represents the sediment volume of the filler per gram settling in the solvent, in mL/g;

V represents the volume of settled filler, in mL;

m represents the mass of filler, in g.

According to the measurement and calculation of sediment volume described above, the sediment volume of each different silica material in different solvents or solvent mixtures was measured and calculated, as listed in Table 1 to Table 6.

TABLE 1

Sediment volume of silica in MEK

| silica | sediment volume (mL/g) | | | |
|---|---|---|---|---|
| | first | second | third | average (AVG) |
| HM052BNJ | 0 | 0 | 0 | 0 |
| HM052BYJ | 0 | 0 | 0 | 0 |
| HM072BNJ | 0 | 0 | 0 | 0 |
| HM031BNJ | 0 | 0 | 0 | 0 |
| HM102BNJ | 0.39 | 0.37 | 0.40 | 0.39 |
| spherical silica A | 0.61 | 0.58 | 0.62 | 0.60 |
| spherical silica B | 1.08 | 1.11 | 1.09 | 1.09 |
| SC2050-KNK | 0.91 | 0.89 | 0.88 | 0.89 |

TABLE 2

Sediment volume of silica in DMAC

| silica | sediment volume (mL/g) | | | |
|---|---|---|---|---|
| | first | second | third | average (AVG) |
| HM052BNJ | 0 | 0 | 0 | 0 |
| HM052BYJ | 0 | 0 | 0 | 0 |
| HM072BNJ | 0 | 0 | 0 | 0 |
| HM031BNJ | 0 | 0 | 0 | 0 |
| HM102BNJ | 0.30 | 0.29 | 0.32 | 0.30 |
| spherical silica A | 0.88 | 0.85 | 0.87 | 0.87 |
| spherical silica B | 0.88 | 0.91 | 0.90 | 0.90 |
| SC2050-KNK | 0.89 | 0.87 | 0.88 | 0.88 |

TABLE 3

Sediment volume of silica in toluene

| silica | sediment volume (mL/g) | | | |
|---|---|---|---|---|
| | first | second | third | average (AVG) |
| HM052BNJ | 0 | 0 | 0 | 0 |
| HM052BYJ | 0 | 0 | 0 | 0 |
| HM072BNJ | 0 | 0 | 0 | 0 |
| HM031BNJ | 0 | 0 | 0 | 0 |
| HM102BNJ | 0.35 | 0.39 | 0.38 | 0.37 |
| spherical silica A | 0.89 | 0.90 | 0.92 | 0.90 |
| spherical silica B | 0.79 | 0.81 | 0.80 | 0.80 |
| SC2050-KNK | 1.47 | 1.44 | 1.46 | 1.46 |

TABLE 4

Sediment volume of silica in solvent mixture
(mass ratio of MEK:DMAC is 1:1)

| silica | sediment volume (mL/g) | | | |
|---|---|---|---|---|
| | first | second | third | average (AVG) |
| HM052BNJ | 0 | 0 | 0 | 0 |
| HM052BYJ | 0 | 0 | 0 | 0 |
| HM072BNJ | 0 | 0 | 0 | 0 |
| HM031BNJ | 0 | 0 | 0 | 0 |
| HM102BNJ | 0.35 | 0.36 | 0.34 | 0.35 |
| spherical silica A | 0.78 | 0.80 | 0.77 | 0.78 |
| spherical silica B | 0.93 | 0.91 | 0.94 | 0.93 |
| SC2050-KNK | 0.89 | 0.88 | 0.88 | 0.88 |

TABLE 5

Sediment volume of silica in solvent mixture
(mass ratio of MEK:DMAC is 9:1)

| silica | sediment volume (mL/g) | | | |
|---|---|---|---|---|
| | first | second | third | average (AVG) |
| HM052BNJ | 0 | 0 | 0 | 0 |
| HM052BYJ | 0 | 0 | 0 | 0 |
| HM072BNJ | 0 | 0 | 0 | 0 |
| HM031BNJ | 0 | 0 | 0 | 0 |
| HM102BNJ | 0.36 | 0.38 | 0.39 | 0.38 |
| spherical silica A | 0.68 | 0.65 | 0.67 | 0.67 |
| spherical silica B | 0.98 | 1.01 | 1.00 | 1.00 |
| SC2050-KNK | 0.89 | 0.91 | 0.87 | 0.89 |

TABLE 6

Sediment volume of silica in solvent mixture
(mass ratio of MEK:DMAC is 1:9)

| silica | sediment volume (mL/g) | | | |
|---|---|---|---|---|
| | first | second | third | average (AVG) |
| HM052BNJ | 0 | 0 | 0 | 0 |
| HM052BYJ | 0 | 0 | 0 | 0 |
| HM072BNJ | 0 | 0 | 0 | 0 |
| HM031BNJ | 0 | 0 | 0 | 0 |
| HM102BNJ | 0.31 | 0.29 | 0.33 | 0.31 |
| spherical silica A | 0.83 | 0.85 | 0.82 | 0.83 |
| spherical silica B | 0.89 | 0.91 | 0.93 | 0.91 |
| SC2050-KNK | 0.89 | 0.87 | 0.89 | 0.88 |

Compositions and test results of resin compositions of Examples and Comparative Examples are listed below (in part by weight):

TABLE 7

Resin compositions of Examples (in part by weight)

| component | | E1 | E2 | E3 | E4 | E5 | E6 | E7 | E8 |
|---|---|---|---|---|---|---|---|---|---|
| maleimide resin | BMI-2300 | 100 | 100 | 100 | 100 | 100 | 50 | | 25 |
| | BMI-70 | | | | | | 50 | 100 | 25 |
| | BMI-3000 | | | | | | | | 30 |
| | BMI-80 | | | | | | | | 20 |
| benzoxazine resin | PF-3500 | 40 | 40 | 40 | 40 | 40 | 40 | 40 | 40 |
| | LZ8290 | | | | | | | | |
| | LZ8280 | | | | | | | | |
| | KZH-5031 | | | | | | | | |
| epoxy resin | NC-3000H | 20 | 20 | 20 | 20 | 20 | 20 | 20 | 20 |
| | NPPN260 | | | | | | | | |
| | HP-7200HH | | | | | | | | |
| silica | HM031BNJ | 160 | | | | | | | |
| | HM052BNJ | | 160 | | | | 160 | 160 | 160 |
| | HM052BYJ | | | 160 | | | | | |
| | HM072BNJ | | | | 160 | | | | |
| | HM102BNJ | | | | | 160 | | | |
| | spherical silica A | | | | | | | | |
| | spherical silica B | | | | | | | | |
| | SC2050-KNK | | | | | | | | |
| | spherical silica C | | | | | | | | |
| | DL0110 | | | | | | | | |
| | D70 | | | | | | | | |
| other filler | KB-01D | | | | | | | | |
| imidazole compound | C8Z | | | | | | | | |
| | C11Z | 0.8 | 0.8 | 0.8 | 0.8 | 0.8 | 0.8 | 0.8 | 0.8 |
| | C17Z | | | | | | | | |
| | 2MZ | | | | | | | | |
| | 2E4MZ | | | | | | | | |
| | 2PZ | | | | | | | | |
| accelerator | 25B | | | | | | | | |
| solvent | MEK | 100 | 100 | 100 | 100 | 100 | 80 | 150 | 120 |
| | DMAC | 30 | 30 | 30 | 30 | 30 | 50 | 50 | 60 |

TABLE 8

Resin compositions of Examples (in part by weight)

| component | | E9 | E10 | E11 | E12 | E13 | E14 | E15 |
|---|---|---|---|---|---|---|---|---|
| maleimide resin | BMI-2300 | 100 | 100 | 100 | 100 | 100 | 100 | 100 |
| | BMI-70 | | | | | | | |
| | BMI-3000 | | | | | | | |
| | BMI-80 | | | | | | | |
| benzoxazine resin | PF-3500 | 40 | 40 | 40 | 40 | 40 | 40 | 40 |
| | LZ8290 | | | | | | | |
| | LZ8280 | | | | | | | |
| | KZH-5031 | | | | | | | |
| epoxy resin | NC-3000H | 20 | 20 | 20 | 20 | 20 | 20 | 20 |
| | NPPN260 | | | | | | | |
| | HP-7200HH | | | | | | | |
| silica | HM031BNJ | | | | | | | |
| | HM052BNJ | 160 | 160 | 120 | 240 | 120 | 160 | 160 |
| | HM052BYJ | | | | | | | |
| | HM072BNJ | | | | | | | |
| | HM102BNJ | | | | | | | |
| | spherical silica A | | | | | | | |
| | spherical silica B | | | | | | | |
| | SC2050-KNK | | | | | | | |
| | spherical silica C | | | | | | | |
| | DL0110 | | | | | 40 | | |
| | D70 | | | | | | | |
| other filler | KB-01D | | | | | | | |
| imidazole compound | C8Z | 0.8 | | | | | | |
| | C11Z | | | 0.8 | 0.8 | 0.8 | 0.5 | 1.6 |
| | C17Z | | 0.8 | | | | | |
| | 2MZ | | | | | | | |
| | 2E4MZ | | | | | | | |
| | 2PZ | | | | | | | |

TABLE 8-continued

Resin compositions of Examples (in part by weight)

| component | | E9 | E10 | E11 | E12 | E13 | E14 | E15 |
|---|---|---|---|---|---|---|---|---|
| accelerator | 25B | | | | | | | |
| solvent | MEK | 100 | 100 | 100 | 100 | 100 | 100 | 100 |
|  | DMAC | 30 | 30 | 30 | 30 | 30 | 30 | 30 |

TABLE 9

Resin compositions of Examples (in part by weight)

| component | | E16 | E17 | E18 | E19 | E20 | E21 | E22 |
|---|---|---|---|---|---|---|---|---|
| maleimide resin | BMI-2300 | 100 | 100 | 100 | 100 | 100 | 100 | 100 |
|  | BMI-70 | | | | | | | |
|  | BMI-3000 | | | | | | | |
|  | BMI-80 | | | | | | | |
| benzoxazine resin | PF-3500 | | | 20 | 60 | 40 | 40 | 30 |
|  | LZ8290 | 40 | 20 | | | | | |
|  | LZ8280 | | 15 | | | | | |
|  | KZH-5031 | | 5 | | | | | |
| epoxy resin | NC-3000H | 20 | 20 | 20 | 20 | 5 | 25 | 20 |
|  | NPPN260 | | | | | | 10 | |
|  | HP-7200HH | | | | | | 5 | |
| silica | HM031BNJ | | | | | | | |
|  | HM052BNJ | 160 | 160 | 160 | 160 | 160 | 160 | 160 |
|  | HM052BYJ | | | | | | | |
|  | HM072BNJ | | | | | | | |
|  | HM102BNJ | | | | | | | |
|  | spherical silica A | | | | | | | |
|  | spherical silica B | | | | | | | |
|  | SC2050-KNK spherical silica C | | | | | | | |
|  | DL0110 | | | | | | | |
|  | D70 | | | | | | | |
| other filler | KB-01D | | | | | | | |
| imidazole compound | C8Z | | | | | | | |
|  | C11Z | 0.8 | 0.8 | 0.8 | 0.8 | 0.8 | 0.8 | 0.8 |
|  | C17Z | | | | | | | |
|  | 2MZ | | | | | | | |
|  | 2E4MZ | | | | | | | |
|  | 2PZ | | | | | | | |
| accelerator | 25B | | | | | | | |
| solvent | MEK | 100 | 100 | 100 | 100 | 100 | 100 | 100 |
|  | DMAC | 30 | 30 | 30 | 30 | 30 | 30 | 30 |

TABLE 10

Resin compositions of Comparative Examples (in part by weight)

| component | | C1 | C2 | C3 | C4 | C5 | C6 | C7 | C8 |
|---|---|---|---|---|---|---|---|---|---|
| maleimide resin | BMI-2300 | 100 | 100 | 100 | 100 | 100 | 100 | 100 | 100 |
|  | BMI-70 | | | | | | | | |
|  | BMI-3000 | | | | | | | | |
|  | BMI-80 | | | | | | | | |
| benzoxazine resin | PF-3500 | 40 | 40 | 40 | 40 | 40 | 40 | 40 | 40 |
|  | LZ8290 | | | | | | | | |
|  | LZ8280 | | | | | | | | |
|  | KZH-5031 | | | | | | | | |
| epoxy resin | NC-3000H | 20 | 20 | 20 | 20 | 20 | 20 | 20 | 20 |
|  | NPPN260 | | | | | | | | |
|  | HP-7200HH | | | | | | | | |
| silica | HM031BNJ | | | | | | | | |
|  | HM052BNJ | | | | | | | 160 | 160 |
|  | HM052BYJ | | | | | | | | |
|  | HM072BNJ | | | | | | | | |
|  | HM102BNJ | | | | | | | | |
|  | spherical silica A | 160 | | | | | | | |

TABLE 10-continued

Resin compositions of Comparative Examples (in part by weight)

| component | | C1 | C2 | C3 | C4 | C5 | C6 | C7 | C8 |
|---|---|---|---|---|---|---|---|---|---|
| | spherical silica B | | 160 | | | | | | |
| | SC2050-KNK | | | 160 | | | | | |
| | spherical silica C | | | | 160 | | | | |
| | DL0110 | | | | | 160 | | | |
| | D70 | | | | | | | | |
| other filler | KB-01D | | | | | | 160 | | |
| imidazole compound | C8Z | | | | | | | | |
| | C11Z | 0.8 | 0.8 | 0.8 | 0.8 | 0.8 | 0.8 | | |
| | C17Z | | | | | | | | |
| | 2M2 | | | | | | | 0.8 | |
| | 2E4MZ | | | | | | | | 0.8 |
| | 2PZ | | | | | | | | |
| accelerator | 25B | | | | | | | | |
| solvent | MEK | 100 | 100 | 100 | 100 | 100 | 100 | 100 | 100 |
| | DMAC | 30 | 30 | 30 | 30 | 30 | 30 | 30 | 30 |

TABLE 11

Resin compositions of Comparative Examples (in part by weight)

| component | | C9 | C10 | C11 | C12 | C13 | C14 | C15 |
|---|---|---|---|---|---|---|---|---|
| maleimide resin | BMI-2300 | 100 | 100 | 100 | 100 | 100 | 100 | 100 |
| | BMI-70 | | | | | | | |
| | BMI-3000 | | | | | | | |
| | BMI-80 | | | | | | | |
| benzoxazine resin | PF-3500 | 40 | 40 | 40 | 40 | 40 | 40 | 10 |
| | LZ8290 | | | | | | | |
| | LZ8280 | | | | | | | |
| | KZH-5031 | | | | | | | |
| epoxy resin | NC-3000H | 20 | 20 | 20 | 20 | 20 | 20 | 20 |
| | NPPN260 | | | | | | | |
| | HP-7200HH | | | | | | | |
| silica | HM031BNJ | | | | | | | |
| | HM052BNJ | 160 | 160 | 80 | 280 | 160 | 160 | 160 |
| | HM052BYJ | | | | | | | |
| | HM072BNJ | | | | | | | |
| | HM102BNJ | | | | | | | |
| | spherical silica A | | | | | | | |
| | spherical silica B | | | | | | | |
| | SC2050-KNK | | | | | | | |
| | spherical silica C | | | | | | | |
| | DL0110 | | | | | | | |
| | D70 | | | | | | | |
| other filler | KB-01D | | | | | | | |
| imidazole compound | C8Z | | | | | | | |
| | C11Z | | | 0.8 | 0.8 | 0.1 | 2.5 | 0.8 |
| | C17Z | | | | | | | |
| | 2M2 | | | | | | | |
| | 2E4MZ | | | | | | | |
| | 2PZ | 0.8 | | | | | | |
| accelerator | 25B | | 0.5 | | | | | |
| solvent | MEK | 100 | 100 | 100 | 100 | 100 | 100 | 100 |
| | DMAC | 30 | 30 | 30 | 30 | 30 | 30 | 30 |

TABLE 12

Resin compositions of Comparative Examples (in part by weight)

| component | | C16 | C17 | C18 | C19 | C20 | C21 | C22 |
|---|---|---|---|---|---|---|---|---|
| maleimide resin | BMI-2300 | 100 | 100 | 100 | 100 | 100 | 100 | 100 |
| | BMI-70 | | | | | | | |
| | BMI-3000 | | | | | | | |
| | BMI-80 | | | | | | | |
| benzoxazine resin | PF-3500 | 80 | 40 | 40 | 40 | 40 | 40 | 40 |
| | LZ8290 | | | | | | | |
| | LZ8280 | | | | | | | |
| | KZH-5031 | | | | | | | |
| epoxy resin | NC-3000H | 20 | | 30 | 20 | 20 | 20 | 20 |
| | NPPN260 | | 30 | | | | | |
| | HP-7200HH | | | | | | | |
| silica | HM031BNJ | | | | | | | |
| | HM052BNJ | 160 | 160 | 160 | | | 160 | |
| | HM052BYJ | | | | | | | |
| | HM072BNJ | | | | | | | |
| | HM102BNJ | | | | | | | |
| | spherical silica A | | | | | | | |
| | spherical silica B | | | | | | | |
| | SC2050-KNK spherical silica C | | | | | | | |
| | DL0110 | | | | | 160 | | |
| | D70 | | | | 160 | | | |
| other filler | KB-01D | | | | | | | |
| imidazole compound | C8Z | | | | | | | |
| | C11Z | 0.8 | 0.8 | 0.8 | | | | 0.8 |
| | C17Z | | | | | | | |
| | 2MZ | | | | | 0.8 | | |
| | 2E4MZ | | | | 0.8 | | | |
| | 2PZ | | | | | | | |
| accelerator | 25B | | | | | | | |
| solvent | MEK | 100 | 100 | 100 | 100 | 100 | 100 | 100 |
| | DMAC | 30 | 30 | 30 | 30 | 30 | 30 | 30 |

Resin compositions from Table 7 to Table 12 were used to make varnishes and various samples (specimens) as described below and tested under conditions specified below so as to obtain the test results in Table 13 to Table 18.

Varnish

Components of the resin composition from each Example (abbreviated as E, such as E1 to E22) or Comparative Example (abbreviated as C, such as C1 to C22) were added to a stirrer according to the amounts listed in Tables 7-12 for stirring and well-mixing to form a resin varnish.

For example, in Example E1, 100 parts by weight of maleimide resin (BMI-2300), 40 parts by weight of benzoxazine resin (PF-3500) and 20 parts by weight of epoxy resin (NC-3000H) were added to a stirrer containing 100 parts by weight of methyl ethyl ketone (MEK) and 30 parts by weight of dimethyl acetamide (DMAC) and stirred to fully dissolve the solid components to form a homogeneous liquid state. Then 160 parts by weight of spherical silica (HM031BNJ) having a sediment volume of 0 mL/g and a particle size distribution D50 of less than or equal to 1.0 μm were added and well dispersed, followed by adding 0.8 part by weight of an imidazole compound having a long-chain alkyl group (C11Z, pre-dissolved by a proper amount of solvent) and stirring for 1 hour to obtain the varnish of resin composition E1.

In addition, according to the components and amounts listed in Table 7 to Table 12 above, varnishes of Examples E2 to E22 and Comparative Examples C1 to C22 were prepared following the preparation process of the varnish of Example E1.

Prepreg (Using 2116 E-Glass Fiber Fabric)

Resin compositions from different Examples (E1 to E22) and Comparative Examples (C1 to C22) listed in Table 7 to Table 12 were respectively added to a stirred tank, well mixed and fully dissolved as varnishes and then added to an impregnation tank. A fiberglass fabric (e.g., 2116 E-glass fiber fabric) was passed through the impregnation tank to adhere the resin composition on the fiberglass fabric, followed by heating at 120° C. to 150° C. to the semi-cured state (B-Stage) to obtain the prepreg (resin content of about 52%).

Prepreg (Using 1080 E-Glass Fiber Fabric)

Resin compositions from different Examples (E1 to E22) and Comparative Examples (C1 to C22) listed in Table 7 to Table 12 were respectively added to a stirred tank, well mixed and fully dissolved as varnishes and then added to an impregnation tank. A fiberglass fabric (e.g., 1080 E-glass fiber fabric) was passed through the impregnation tank to adhere the resin composition on the fiberglass fabric, followed by heating at 120° C. to 150° C. to the semi-cured state (B-Stage) to obtain the prepreg (resin content of about 70%).

Prepreg (Using 1017 E-Glass Fiber Fabric)

Resin compositions from different Examples (E1 to E22) and Comparative Examples (C1 to C22) listed in Table 7 to Table 12 were respectively added to a stirred tank, well mixed and fully dissolved as varnishes and then added to an impregnation tank. A fiberglass fabric (e.g., 1017 E-glass fiber fabric) was passed through the impregnation tank to adhere the resin composition on the fiberglass fabric, followed by heating at 120° C. to 150° C. to the semi-cured state (B-Stage) to obtain the prepreg (resin content of about 76%).

Copper-Clad Laminate (Obtained by Laminating Eight Prepregs)

Two 18 μm reverse treatment copper foils (RTFs) and eight prepregs made from each resin composition (using 2116 E-glass fiber fabrics) were prepared batchwise. Each prepreg has a resin content of about 52%. A copper foil, eight prepregs and a copper foil were superimposed in such order and then subject to a vacuum condition for lamination at 200° C. for 2 hours to form each copper-clad laminate sample. Insulation layers were formed by curing (C-stage) eight sheets of superimposed prepreg between the two copper foils, and the resin content of the insulation layers was about 52%.

Copper-Free Laminate (Obtained by Laminating Eight Prepregs)

Each copper-clad laminate was etched to remove the two copper foils to obtain a copper-free laminate sample made from laminating eight prepregs, and each copper-free laminate had a resin content of about 52%.

Copper-Free Laminate (Obtained by Laminating Two Prepregs)

Two 18 μm reverse treatment copper foils (RTFs) and two prepregs made from each resin composition (using 1080 E-glass fiber fabrics) were prepared batchwise. Each prepreg has a resin content of about 70%. A copper foil, two prepregs and a copper foil were superimposed in such order and then subject to a vacuum condition for lamination at 200° C. for 2 hours to form each copper-clad laminate, which was then subject to an etching process to remove the copper foils on both sides to obtain a copper-free laminate sample. Insulation layers were formed by curing (C-stage) two sheets of superimposed prepreg between the two copper foils, and the resin content of the insulation layers was about 70%.

Four-Layer Circuit Board

A core was prepared as follows: preparing four prepregs (e.g., EM-827 available from Elite Material Co., Ltd., using 7628 E-glass fabric, RC=42%); a copper foil was covered on each of the two sides of the four superimposed prepregs, followed by lamination and curing for 2 hours in vacuum at high temperature (195° C.) and high pressure (360 psi) to obtain a copper-containing core. Then the core was subject to a brown oxidation process to obtain a brown oxide treated core. Next, two sides on the outer layers of the brown oxide treated core were respectively covered with a prepreg (using 2116 E-glass fabric) from each Example or Comparative Example and a piece of 2 μm carrier-attached ultra-thin copper foil, followed by lamination for 2 hours in vacuum at 195° C. to obtain a laminate containing an ultra-thin copper foil. Carrier copper foil on the ultra-thin copper surface of the laminate was peeled off, and electroplating of the whole plate was performed without cleaning, such that the copper layer has a thickness of 35 μm to form a four-layer circuit board.

Copper-Free Circuit Board (Two-Layer)

A core was prepared as follows: preparing one prepreg (e.g., EM-390 available from Elite Material Co., Ltd., using 1078 E-glass fabric, RC=57%); a copper foil was covered on each of the two sides of the prepreg, followed by lamination and curing for 2 hours in vacuum at high temperature (195° C.) and high pressure (360 psi) to obtain a copper-containing core. Then the core was subject to a brown oxidation and etching processes to obtain a brown oxide treated core with traces. Next, two sides on the outer layers of the brown oxide treated core with traces were respectively covered with a prepreg (using 1017 E-glass fabric) from each Example or Comparative Example and a piece of 0.5 oz (18 μm in thickness) reverse treatment copper foil (RTF), followed by lamination for 2 hours in vacuum at 195° C. to obtain a circuit board containing copper foils. Next, each circuit board was etched to remove the two copper foils to obtain a copper-free circuit board (two-layer).

Test items and test methods are described below.

1. Glass Transition Temperature (Tg)

A copper-free laminate (obtained by laminating eight prepregs) sample was subject to glass transition temperature measurement by using the dynamic mechanical analysis (DMA) method. Each sample was heated from 35° C. to 350° C. at a heating rate of 2° C./minute and then subject to the measurement of glass transition temperature (° C.) by reference to the method described in IPC-TM-650 2.4.24.4.

For example, articles made from the resin composition disclosed herein have a high glass transition temperature as measured by reference to IPC-TM-650 2.4.24.4, such as a glass transition temperature Tg of greater than or equal to 301° C., such as between 301° C. and 333° C.

2. Ratio of Thermal Expansion

A copper-free laminate sample (obtained by laminating eight prepregs) was subject to thermal mechanical analysis (TMA) during the measurement of ratio of thermal expansion (i.e., ratio of dimensional change). Each sample was heated from 35° C. to 265° C. at a heating rate of 10° C./minute and then subject to the measurement of dimensional change (%) between 50° C. and 260° C. in Z-axis by reference to the method described in IPC-TM-650 2.4.24.5, wherein lower dimensional change percentage is more preferred.

In general, high ratio of thermal expansion in Z-axis of a laminate indicates that the copper-clad laminate has high ratio of dimensional change, which may result in reliability problems such as delamination during printed circuit board fabrication. In the present technical field, lower ratio of thermal expansion is more preferred, and a difference in ratio of thermal expansion of greater than or equal to 0.1% represents a significant difference.

For example, articles made from the resin composition disclosed herein are characterized by a ratio of thermal expansion as measured by reference to IPC-TM-650 2.4.24.5 of less than or equal to 1.33%, such as less than or equal to 1.08%, 1.12%, 1.14%, 1.15%, 1.16%, 1.18%, 1.19%, 1.20%, 1.21%, 1.25%, 1.26%, 1.27%, 1.29%, 1.30% or 1.33%, such as between 1.08% and 1.33%.

3. Ordinary Copper Foil Peeling Strength (Peel Strength, P/S)

A copper-clad laminate (obtained by laminating eight prepregs) was cut into a rectangular specimen with a width of 24 mm and a length of greater than 60 mm, which was then etched to remove surface copper foil and leave a rectangular copper foil with a width of 3.18 mm and a length of greater than 60 mm. The specimen was tested by using a tensile strength tester by reference to IPC-TM-650 2.4.8 at ambient temperature (about 25° C.) to measure the force (lb/in) required to pull off the copper foil from the laminate surface. A higher copper foil peeling strength is more preferred, and a difference in copper foil peeling strength of greater than or equal to 0.1 lb/in represents a significant difference.

For example, articles made from the resin composition disclosed herein are characterized by having a copper foil peeling strength as measured by reference to IPC-TM-650 2.4.8 of greater than or equal to 4.7 lb/in, preferably greater than or equal to 4.8 lb/in, 4.9 lb/in, 5.0 lb/in, 5.1 lb/in, 5.2 lb/in or 5.3 lb/in, such as between 4.7 lb/in and 5.3 lb/in or between 4.8 lb/in and 5.3 lb/in.

4. Ultra-Thin Copper Foil Peeling Strength (Peel Strength, P/S)

The four-layer circuit board was cut into a rectangular specimen with a width of 24 mm and a length of greater than 60 mm, which was etched to remove surface copper foil and leave a rectangular copper foil with a width of 3.18 mm and a length of greater than 60 mm. The specimen was tested by using a tensile strength tester by reference to IPC-TM-650 2.4.8 at ambient temperature (about 25° C.) to measure the force (lb/in) required to pull off the copper foil from the laminate surface. A higher copper foil peeling strength is more preferred, and a difference in copper foil peeling strength of greater than or equal to 0.1 lb/in represents a significant difference.

For example, articles made from the resin composition disclosed herein are characterized by having a copper foil peeling strength as measured by reference to IPC-TM-650 2.4.8 of greater than or equal to 4.3 lb/in, preferably greater than or equal to 4.4 lb/in, 4.5 lb/in, 4.6 lb/in, 4.7 lb/in, 4.8 lb/in or 4.9 lb/in, such as between 4.3 lb/in and 4.9 lb/in or between 4.4 lb/in and 4.9 lb/in.

5. Thermal Resistance after Moisture Absorption (PCT)

A copper-free laminate sample (obtained by laminating eight prepregs) was subject to pressure cooking test (PCT) by reference to IPC-TM-650 2.6.16.1 and 168 hours of moisture absorption (testing temperature of 121° C., relative humidity of 100%), and then by reference to IPC-TM-650 2.4.23, the sample after moisture absorption was immersed into a 288° C. solder bath for 20 seconds, removed and then inspected to determine the absence or presence of delamination, such as whether interlayer delamination or blistering occurs between insulation layers. Interlayer delamination or blistering may occur between any layers of the laminate.

For example, articles made from the resin composition disclosed herein are characterized by no delamination in a thermal resistance test after moisture absorption by reference to IPC-TM-650 2.6.16.1 and IPC-TM-650 2.4.23. Absence of delamination is designated as "Pass", and occurrence of delamination is designated as "Fail".

6. Dissipation Factor (Df)

In the measurement of dissipation factor, a copper-free laminate sample (obtained by laminating two prepregs) was tested by using a microwave dielectrometer available from AET Corp. by reference to JIS C2565 at 10 GHz for analyzing each sample. Lower dissipation factor represents better dielectric properties of the sample.

Under a 10 GHz frequency, for a Df value of between 0.0050 and 0.0100, a difference in Df of less than 0.0003 represents no substantial difference in dissipation factor in different laminates, and a difference in Df of greater than or equal to 0.0003 represents a substantial difference (i.e., significant technical difficulty) in dissipation factor in different laminates.

For example, articles made from the resin composition disclosed herein, as measured by reference to JIS C2565 at 10 GHz, have a dissipation factor of less than or equal to 0.0075, such as between 0.0068 and 0.0075.

7. Appearance of Copper-Free Circuit Board

Figure 2:
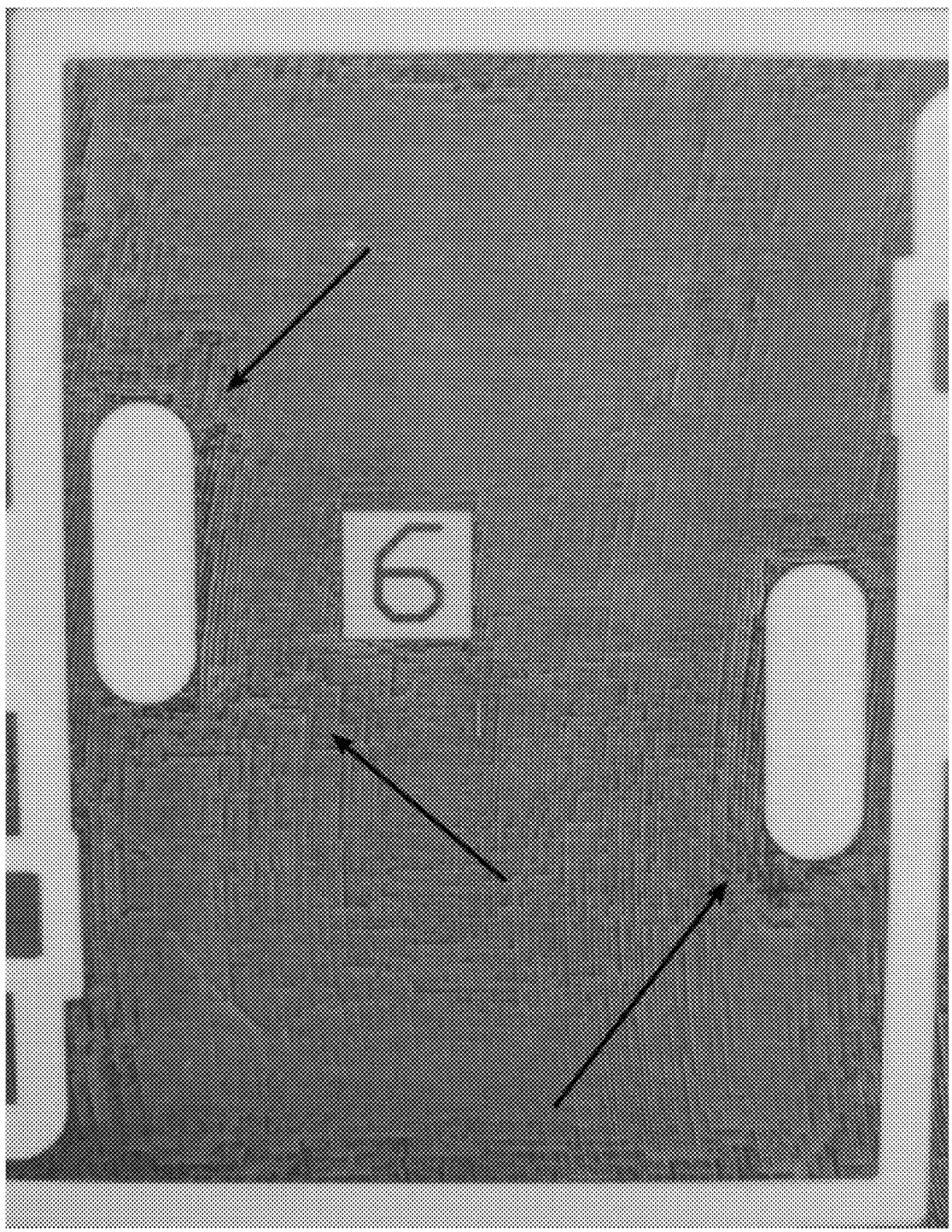
FIG. 2 illustrates a copper-free circuit board having a surface with patterns.

The surface of the copper-free circuit board (two-layer) was examined with naked eyes to determine whether branch-like pattern was present, which represents poor compatibility of resins and fillers in the resin composition or high flowability variation that causes inhomogeneity. The presence of pattern in a copper-free circuit board may cause poor thermal resistance, poor dissipation factor or high variation of dissipation factor. A designation of "Y" is given if at least one pattern is present on the surface of the copper-free circuit board, and a designation of "N" is given if no pattern is present. FIG. 1 illustrates a copper-free circuit board having a surface without patterns, and FIG. 2 illustrates a copper-free circuit board having a surface with patterns, wherein serious patterns are indicated by arrows. The "6" sign in FIG. 1 and FIG. 2 indicates that different copper-free circuit board samples were divided into 20 areas and the sixth area of different samples was used in comparison.

8. Resin Cluster of Copper-Free Circuit Board

A 1cm rectangular copper-free circuit board (two-layer) sample having an open area and a copper area was filled with resin and sliced, and a scanning electron microscope (SEM) was used to examine the cross-section of the sample to observe resin clusters of the 1 cm rectangular copper-free circuit board (two-layer) sample. The number of resin clusters was counted as follows: finding the resin cluster with a 300× magnification and then observing the resin cluster with a 1000× magnification and measuring the size of the resin cluster with the SEM. For example, if the size of one resin cluster measured by SEM is less than 20 μm (<20 μm), one resin cluster of less than 20 μm is recorded; for example, if the size of one resin cluster measured by SEM is between 20 μm and 75 μm, one resin cluster of between 20 μm and 75 μm is recorded; for example, if the size of one resin cluster measured by SEM is greater than 75 μm, one resin cluster of greater than 75 μm is recorded. In this way, the process described above was repeated until the whole area of the 1cm rectangular copper-free circuit board (two-layer) sample was fully examined, so as to count the respective number of resin clusters, i.e., less than 20 μm (<20 μm), between 20 μm and 75 μm (20-75 μm), and greater than 75 μm (>75 μm), in the 1cm rectangular copper-free circuit board (two-layer) sample.

Figure 3:
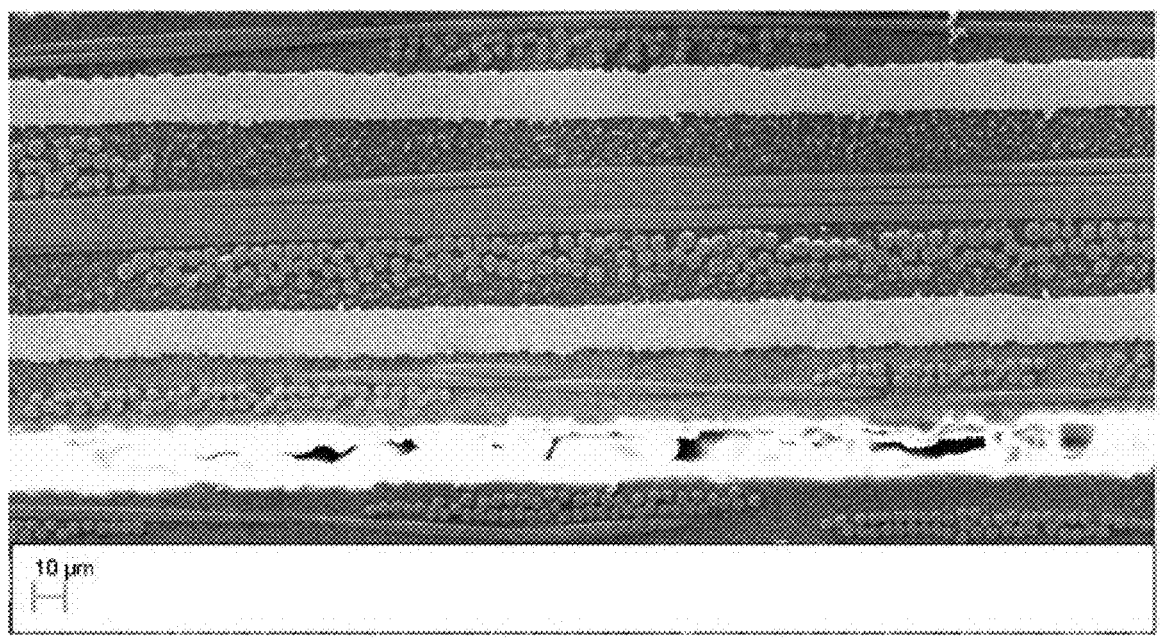
FIG. 3 is an SEM photograph showing a copper-free circuit board of one Example not containing resin cluster.
Figure 4:
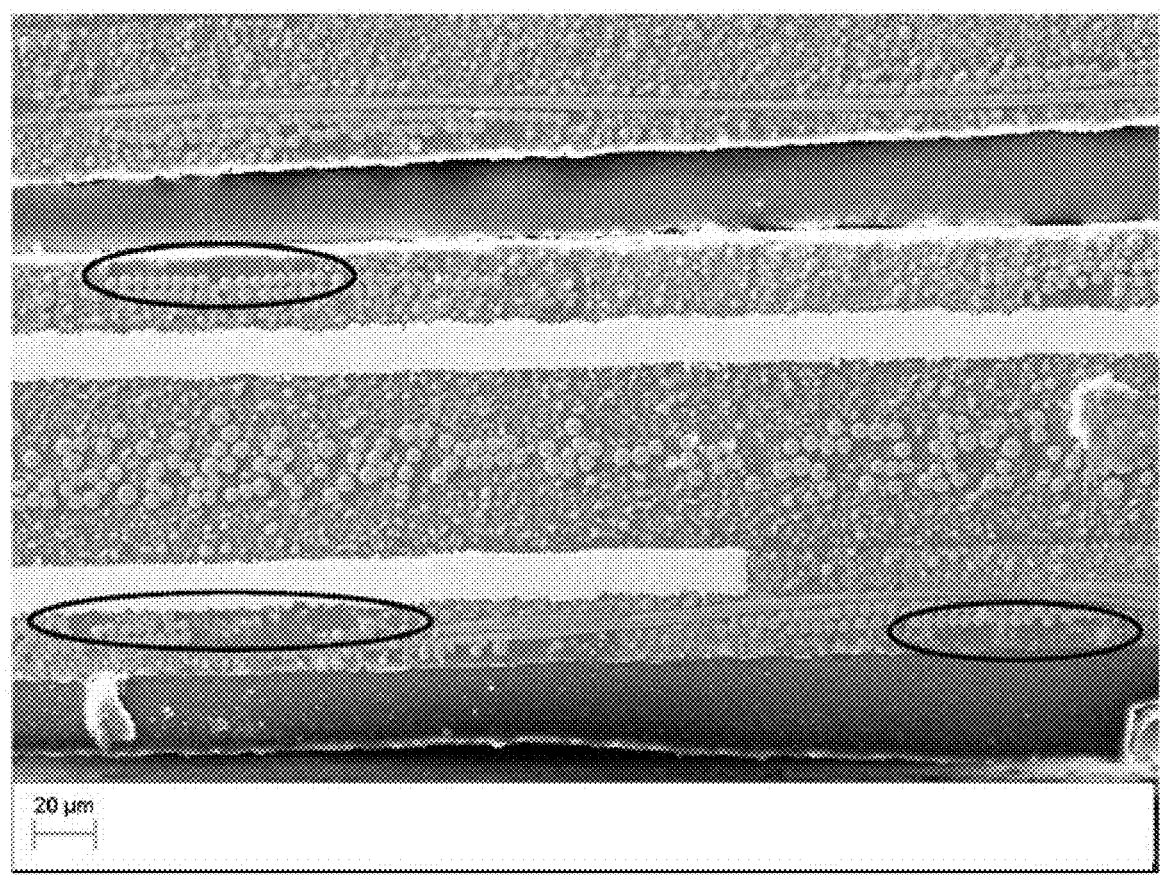
FIG. 4 is an SEM photograph showing a copper-free circuit board of one Comparative Example containing resin cluster.

For example, FIG. 3 is an SEM photograph showing a 1 cm rectangular copper-free circuit board (two-layer) sample not containing resin cluster, and FIG. 4 is an SEM photograph showing a 1 cm rectangular copper-free circuit board (two-layer) sample containing resin clusters, wherein the three circles in the SEM photograph represent the resin clusters.

Fewer resin cluster or smaller resin cluster in the 1 cm rectangular copper-free circuit board (two-layer) sample represents better flowability or compatibility of resins and fillers in the sample.

For example, the presence of one resin cluster of 20 μm to 75 μm is worse than the presence of one resin cluster of less than 20 μm; similarly, the presence of one resin cluster of greater than 75 μm is worse than the presence of one resin cluster of 20 μm to 75 μm.

A difference of less than or equal to 1 in the number of resin cluster of less than 20 μm represents no substantial difference in the number of resin cluster of less than 20 μm in different copper-free circuit boards; a difference of greater than 1 represents a substantial difference (i.e., significant technical difficulty) in the number of resin cluster of less than 20 μm in different samples.

The presence of more than one resin cluster of 20 μm to 75 μm represents the sample is not acceptable, and a difference of greater than or equal to 1 represents a substantial difference (i.e., significant technical difficulty) in the number of resin cluster of 20 μm to 75 μm in different samples.

The presence of any resin cluster of greater than 75 μm is not acceptable, and a difference of greater than or equal to 1 represents a substantial difference (i.e., significant technical difficulty) in the number of resin cluster of greater than 75 μm in different samples.

Results of the aforesaid tests of Examples and Comparative Examples are listed below.

TABLE 13

Test results of resin compositions and articles of Examples

| property | method | unit | E1 | E2 | E3 | E4 | E5 | E6 | E7 | E8 | E9 |
|---|---|---|---|---|---|---|---|---|---|---|---|
| glass transition temperature | DMA | °C. | 330 | 332 | 332 | 329 | 331 | 310 | 301 | 308 | 332 |
| ratio of thermal expansion | TMA | % | 1.19 | 1.20 | 1.21 | 1.18 | 1.19 | 1.29 | 1.33 | 1.27 | 1.19 |
| peel strength | H oz RTF copper foil | lb/in | 5.0 | 5.2 | 5.1 | 5.2 | 5.2 | 5.1 | 5.0 | 5.1 | 5.2 |
|  | ultra-thin copper foil (2 μm) | lb/in | 4.6 | 4.8 | 4.7 | 4.6 | 4.7 | 4.8 | 4.5 | 4.6 | 4.9 |
| thermal resistance after moisture absorption | 168 hours | none | Pass | Pass | Pass | Pass | Pass | Pass | Pass | Pass | Pass |
| dissipation factor | 10 GHz | none | 0.0069 | 0.0070 | 0.0070 | 0.0071 | 0.0070 | 0.0070 | 0.0071 | 0.0071 | 0.0071 |
| resin cluster of copper-free circuit board | <20 μm | none | 0 | 1 | 2 | 3 | 8 | 2 | 4 | 3 | 4 |
|  | 20~75 μm | none | 0 | 0 | 0 | 0 | 1 | 0 | 0 | 0 | 0 |
|  | >75 μm | none | 0 | 0 | 0 | 0 | 0 | 0 | 0 | 0 | 0 |
| appearance of copper-free circuit board | visual inspection | none | N | N | N | N | N | N | N | N | N |

TABLE 14

Test results of resin compositions and articles of Examples

| property | method | unit | E10 | E11 | E12 | E13 | E14 | E15 | E16 | E17 |
|---|---|---|---|---|---|---|---|---|---|---|
| glass transition temperature | DMA | °C. | 326 | 328 | 330 | 329 | 321 | 332 | 333 | 331 |
| ratio of thermal expansion | TMA | % | 1.25 | 1.30 | 1.08 | 1.12 | 1.26 | 1.12 | 1.14 | 1.19 |
| peel strength | H oz RTF copper foil | lb/in | 5.0 | 5.3 | 5.0 | 5.2 | 4.9 | 5.2 | 4.9 | 5.0 |
|  | ultra-thin copper foil (2 μm) | lb/in | 4.6 | 4.8 | 4.5 | 4.9 | 4.5 | 4.7 | 4.5 | 4.5 |
| thermal resistance after moisture absorption | 168 hours | none | Pass | Pass | Pass | Pass | Pass | Pass | Pass | Pass |
| dissipation factor | 10 GHz | none | 0.0072 | 0.0071 | 0.0068 | 0.0071 | 0.0069 | 0.0073 | 0.0073 | 0.0072 |
| resin cluster of copper-free circuit board | <20 μm | none | 2 | 3 | 6 | 4 | 4 | 3 | 2 | 2 |
|  | 20~75 μm | none | 0 | 0 | 0 | 0 | 0 | 0 | 0 | 0 |
|  | >75 μm | none | 0 | 0 | 0 | 0 | 0 | 0 | 0 | 0 |
| appearance of copper-free circuit board | visual inspection | none | N | N | N | N | N | N | N | N |

TABLE 15

Test results of resin compositions and articles of Examples

| property | method | unit | E18 | E19 | E20 | E21 | E22 |
|---|---|---|---|---|---|---|---|
| glass transition temperature | DMA | °C. | 329 | 328 | 330 | 310 | 330 |
| ratio of thermal expansion | TMA | % | 1.16 | 1.19 | 1.15 | 1.26 | 1.18 |
| peel strength | H oz RTF copper foil | lb/in | 4.7 | 5.3 | 4.8 | 5.3 | 5.0 |
|  | ultra-thin copper foil (2 μm) | lb/in | 4.3 | 4.8 | 4.4 | 4.9 | 4.5 |

TABLE 15-continued

Test results of resin compositions and articles of Examples

| property | method | unit | E18 | E19 | E20 | E21 | E22 |
|---|---|---|---|---|---|---|---|
| thermal resistance after moisture absorption | 168 hours | none | Pass | Pass | Pass | Pass | Pass |
| dissipation factor | 10 GHz | none | 0.0072 | 0.0071 | 0.0070 | 0.0075 | 0.0071 |
| resin cluster of copper-free circuit board | <20 μm | none | 2 | 3 | 5 | 2 | 1 |
| | 20~75 μm | none | 0 | 0 | 0 | 0 | 0 |
| | >75 μm | none | 0 | 0 | 0 | 0 | 0 |
| appearance of copper-free circuit board | visual inspection | none | N | N | N | N | N |

TABLE 16

Test results of resin compositions and articles of Comparative Examples

| property | method | unit | C1 | C2 | C3 | C4 | C5 | C6 | C7 | C8 | C9 |
|---|---|---|---|---|---|---|---|---|---|---|---|
| glass transition temperature | DMA | °C. | 329 | 329 | 330 | 330 | 329 | 330 | 333 | 332 | 329 |
| ratio of thermal expansion | TMA | % | 1.20 | 1.21 | 1.20 | 1.19 | 1.19 | 1.20 | 1.20 | 1.20 | 1.23 |
| peel strength | H oz RTF copper foil | lb/in | 4.6 | 4.5 | 5.2 | 5.1 | 5.2 | 4.3 | 5.1 | 5.2 | 5.1 |
| | ultra-thin copper foil (2 μm) | lb/in | 3.5 | 3.6 | 4.8 | 4.6 | 4.7 | 3.9 | 4.7 | 4.9 | 4.7 |
| thermal resistance after moisture absorption | 168 hours | none | Pass | Pass | Pass | Pass | Pass | Fail | Pass | Pass | Pass |
| dissipation factor | 10 GHz | none | 0.0070 | 0.0069 | 0.0071 | 0.0072 | 0.0072 | 0.0093 | 0.0070 | 0.0070 | 0.0071 |
| resin cluster of copper-free circuit board | <20 μm | none | 9 | 20 | 18 | 20 | 12 | 24 | 15 | 16 | 10 |
| | 20~75 μm | none | 4 | 7 | 6 | 8 | 3 | 9 | 8 | 7 | 6 |
| | >75 μm | none | 2 | 3 | 2 | 3 | 1 | 3 | 5 | 5 | 2 |
| appearance of copper-free circuit board | visual inspection | none | Y | Y | Y | Y | Y | Y | Y | Y | Y |

TABLE 17

Test results of resin compositions and articles of Comparative Examples

| property | method | unit | C10 | C11 | C12 | C13 | C14 | C15 | C16 | C17 |
|---|---|---|---|---|---|---|---|---|---|---|
| glass transition temperature | DMA | °C. | 331 | 328 | 331 | 298 | 332 | 329 | 330 | 332 |
| ratio of thermal expansion | TMA | % | 1.20 | 1.60 | 1.01 | 1.39 | 1.21 | 1.20 | 1.21 | 1.08 |
| peel strength | H oz RTF copper foil | lb/in | 5.2 | 5.2 | 4.8 | 4.9 | 5.3 | 4.2 | 5.2 | 4.0 |
| | ultra-thin copper foil (2 μm) | lb/in | 4.7 | 4.8 | 4.2 | 4.5 | 4.8 | 3.6 | 4.7 | 3.4 |
| thermal resistance after moisture absorption | 168 hours | none | Pass | Pass | Pass | Pass | Fail | Fail | Pass | Fail |

TABLE 17-continued

Test results of resin compositions and articles of Comparative Examples

| property | method | unit | C10 | C11 | C12 | C13 | C14 | C15 | C16 | C17 |
|---|---|---|---|---|---|---|---|---|---|---|
| dissipation factor | 10 GHz | none | 0.0072 | 0.0080 | 0.0068 | 0.0068 | 0.0078 | 0.0072 | 0.0071 | 0.0069 |
| resin cluster of copper-free circuit board | <20 μm | none | 20 | 10 | 12 | 8 | 6 | 8 | 8 | 6 |
| | 20~75 μm | none | 9 | 3 | 3 | 3 | 0 | 0 | 2 | 2 |
| | >75 μm | none | 4 | 0 | 1 | 0 | 0 | 0 | 1 | 0 |
| appearance of copper-free circuit board | visual inspection | none | Y | N | Y | N | N | N | Y | N |

TABLE 18

Test results of resin compositions and articles of Comparative Examples

| property | method | unit | C18 | C19 | C20 | C21 | C22 |
|---|---|---|---|---|---|---|---|
| glass transition temperature | DMA | °C. | 295 | 329 | 328 | 290 | 300 |
| ratio of thermal expansion | TMA | % | 1.55 | 1.20 | 1.20 | 1.36 | 1.42 |
| peel strength | H oz RTF copper foil | lb/in | 5.4 | 5.0 | 5.1 | 3.8 | 5.0 |
| | ultra-thin copper foil (2 μm) | lb/in | 5.0 | 4.6 | 4.7 | 3.2 | 4.3 |
| thermal resistance after moisture absorption | 168 hours | none | Fail | Fail | Pass | Fail | Fail |
| dissipation factor | 10 GHz | none | 0.0082 | 0.0080 | 0.0075 | 0.0068 | 0.0081 |
| resin cluster of copper-free circuit board | <20 μm | none | 8 | 21 | 16 | 8 | — |
| | 20~75 μm | none | 2 | 10 | 5 | 3 | — |
| | >75 μm | none | 0 | 5 | 2 | 1 | — |
| appearance of copper-free circuit board | visual inspection | none | N | Y | Y | Y | N |

The following observations can be made according to the test results above.

From a side-by-side comparison of Examples E1-E22 and Comparative Examples C1-C10 and C19-C20, it can be observed that by using a combination of spherical silica having a sediment volume of less than or equal to 0.4 mL/g and a particle size distribution D50 of less than or equal to 1.0 μm and an imidazole compound having a long-chain alkyl group as disclosed herein, in contrast to using a different silica, a different filler or a different imidazole compound, laminates made according the present disclosure may achieve at the same time one, more or all of the following technical effects: low dissipation factor, high thermal resistance after moisture absorption, fewer resin cluster of less than 20 μm, fewer resin cluster of 20 μm to 75 μm and absence of resin cluster of greater than 75 μm in the copper-free circuit board, and normal appearance of the copper-free circuit board.

From a side-by-side comparison of Examples E1-E22 and Comparative Examples C11-C18 and C21-C22, it can be observed that relative to 100 parts by weight of the maleimide resin, when the benzoxazine resin ranges from 20 parts by weight to 60 parts by weight, the epoxy resin ranges from 5 parts by weight to 40 parts by weight, the spherical silica having a sediment volume of less than or equal to 0.4 mL/g and a particle size distribution D50 of less than or equal to 1.0 μm ranges from 120 parts by weight to 240 parts by weight and the imidazole compound having a long-chain alkyl group ranges from 0.5 part by weight to 1.6 parts by weight, in contrast to other embodiments using any component not within the range in part by weight as described above (because Comparative Example C22 did not contain any silica or filler, resin cluster caused by poor compatibility or flowability of resins and silica or other fillers was not observed), laminates made according the present disclosure may achieve at the same time one, more or all of the following technical effects: low dissipation factor, high thermal resistance after moisture absorption, high copper foil peeling strength, fewer resin cluster of less than 20 μm, fewer resin cluster of 20 μm to 75 μm and fewer resin cluster of greater than 75 μm in the copper-free circuit board, and normal appearance of the copper-free circuit board.

From the comparison of all Examples E1-E22 and all Comparative Examples C1-C22, it is confirmed that laminates made according the present disclosure may achieve at the same time one, more or all of the following technical effects: passing the thermal resistance test after moisture absorption, having less than or equal to 8 resin clusters of less than 20 μm, having less than or equal to 1 resin cluster of 20 μm to 75 μm, and having 0 resin cluster of greater than 75 μm in the copper-free circuit board. In contrast, Comparative Examples C1-C22 not using the technical solution of the present disclosure fail to achieve the aforesaid technical effects.

In addition, from the comparison with Example E5 and Comparative Examples C1-C22, it is observed that copper-free circuit boards made from other Examples (i.e., E1-E4 and E6-E22) may further achieve at the same time the following technical effects: passing the thermal resistance test after moisture absorption, having less than or equal to 6 resin clusters of less than 20 μm, and having 0 resin cluster of 20 μm to 75 μm in the copper-free circuit board. In contrast, Example E5 and Comparative Examples C1-C22 fail to achieve the aforesaid technical effects.

In addition, from the comparison with Examples E5 and E18 and Comparative Examples C1-C22, it is observed that laminates made from other Examples (i.e., E1-E4, E6-E17 and E19-E22) may further achieve at the same time the following technical effects: having an ultra-thin copper foil peeling strength (2 μm) of greater than or equal to 4.4 lb/in, passing the thermal resistance test after moisture absorption, or having a dissipation factor of less than or equal to 0.0075, having less than or equal to 6 resin clusters of less than 20 μm, and having 0 resin cluster of 20 μm to 75 μm in the copper-free circuit board. In contrast, Examples E5 and E18 and Comparative Examples C1-C22 fail to achieve the aforesaid technical effects.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as more preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and all foreseeable equivalents at the time of filing this patent application.

What is claimed is:

1. A resin composition, comprising:
   (A) 100 parts by weight of a maleimide resin;
   (B) 20 parts by weight to 60 parts by weight of a benzoxazine resin;
   (C) 5 parts by weight to 40 parts by weight of an epoxy resin;
   (D) 120 parts by weight to 240 parts by weight of silica, wherein the silica comprises spherical silica having a sediment volume of less than or equal to 0.4 mL/g and a particle size distribution D50 of less than or equal to 1.0 μm, and when the sediment volume is measured using at least one of the following solvents: methyl ethyl ketone, toluene, dimethyl acetamide, methanol, ethanol, ethylene glycol methyl ether, acetone, methyl isobutyl ketone, cyclohexanone, xylene, methoxyethyl acetate, ethoxyethyl acetate, propoxyethyl acetate, ethyl acetate, dimethylformamide, propylene glycol methyl ether, or a combination thereof; and
   (E) 0.5 part by weight to 1.6 parts by weight of an imidazole compound having a long-chain alkyl group, wherein the imidazole compound having a long-chain alkyl group comprises octylimidazole, undecylimidazole, heptadecylimidazole, or a combination thereof.

2. The resin composition of claim 1, wherein the maleimide resin comprises 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl -4,4'-diphenyl methane bismaleimide, 4-methyl-1,3-phenylene bismaleimide, 1,6-bismaleimide -(2,2,4-trimethyl)hexane, N-2,3-xylylmaleimide, N-2,6-xylylmaleimide, N-phenylmaleimide, maleimide resin containing an aliphatic long-chain structure, or a combination thereof.

3. The resin composition of claim 1, wherein the benzoxazine resin comprises oxydianiline benzoxazine resin, alkenyl-containing benzoxazine resin, bisphenol A benzoxazine resin, bisphenol F benzoxazine resin, dicyclopentadiene benzoxazine resin, phenolphthalein benzoxazine resin, phosphorus-containing benzoxazine resin, diamino benzoxazine resin, or a combination thereof.

4. The resin composition of claim 1, wherein the silica comprises spherical silica having a sediment volume of 0 mL/g and a particle size distribution D50 of less than or equal to 1.0 μm.

5. The resin composition of claim 1, comprising 30 parts by weight to 60 parts by weight of the benzoxazine resin relative to 100 parts by weight of the maleimide resin.

6. The resin composition of claim 1, wherein a weight ratio of the silica to a total amount of resins is between 0.75:1 and 1.5:1, wherein the total amount of resins comprises all resins in the resin composition except for the silica and the imidazole compound having a long-chain alkyl group.

7. The resin composition of claim 1, further comprising a cyanate ester resin, a polyolefin resin, a small molecule vinyl compound, an acrylate resin, a phenolic resin, a polyphenylene ether resin, a styrene maleic anhydride resin, a polyester resin, an amine curing agent, a polyamide resin, a polyimide resin, or a combination thereof.

8. The resin composition of claim 1, further comprising flame retardant, inorganic filler, curing accelerator, polymerization inhibitor, coloring agent, solvent, toughening agent, silane coupling agent, or a combination thereof.

9. An article made from the resin composition of claim 1, wherein the article comprises a prepreg, a resin film, a laminate, or a printed circuit board.

10. The article of claim 9, having a dissipation factor at 10 GHz as measured by reference to JIS C2565 of less than or equal to 0.0075.

11. The article of claim 9, wherein no delamination occurs after subjecting the article to a thermal resistance test after moisture absorption by reference to IPC-TM-650 2.6.16.1 and IPC-TM-650 2.4.23.

* * * * *